(12) United States Patent
Chang et al.

(10) Patent No.: US 11,387,109 B1
(45) Date of Patent: Jul. 12, 2022

(54) CMP PROCESS AND METHODS THEREOF

(71) Applicant: Taiwan Semiconductor Manufacturing Co., Ltd., Hsinchu (TW)

(72) Inventors: Che-Lun Chang, Hsinchu (TW); Pin-Chuan Su, Hsinchu (TW); Hsin-Chieh Huang, Hsinchu (TW); Ming-Yuan Wu, Hsinchu (TW); Tzu kai Lin, Tainan (TW); Yu-Wen Wang, New Taipei (TW); Che-Yuan Hsu, deseased, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/193,693

(22) Filed: Mar. 5, 2021

(51) Int. Cl.
| | |
|---|---|
| *H01L 21/306* | (2006.01) |
| *H01L 21/02* | (2006.01) |
| *H01L 29/66* | (2006.01) |
| *H01L 21/311* | (2006.01) |
| *H01L 21/308* | (2006.01) |

(52) U.S. Cl.
CPC .. *H01L 21/30625* (2013.01); *H01L 21/02532* (2013.01); *H01L 21/308* (2013.01); *H01L 21/31111* (2013.01); *H01L 21/31116* (2013.01); *H01L 29/66636* (2013.01)

(58) Field of Classification Search
None
See application file for complete search history.

(56) References Cited

U.S. PATENT DOCUMENTS

| | | | |
|---|---|---|---|
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,564,489 B2 | 2/2017 | Yeo et al. | |
| 9,576,814 B2 | 2/2017 | Wu et al. | |
| 9,601,342 B2 | 3/2017 | Lee et al. | |
| 9,608,116 B2 | 3/2017 | Ching et al. | |
| 10,797,052 B2 * | 10/2020 | Lu | H01L 29/1083 |
| 2009/0194772 A1 * | 8/2009 | Stum | H01L 29/1095 257/77 |
| 2015/0263003 A1 * | 9/2015 | Lee | H01L 27/1211 257/351 |
| 2021/0167167 A1 * | 6/2021 | Kawada | H01L 29/66068 |

* cited by examiner

*Primary Examiner* — Allan W. Olsen
(74) *Attorney, Agent, or Firm* — Slater Matsil, LLP

(57) ABSTRACT

A method of forming a semiconductor device includes forming a first epitaxial layer over a substrate to form a wafer, depositing a dielectric layer over the first epitaxial layer, patterning the dielectric layer to form an opening, etching the first epitaxial layer through the opening to form a recess, forming a second epitaxial layer in the recess, etching the dielectric layer to expose a top surface of the first epitaxial layer, and planarizing the exposed top surface of the first epitaxial layer and a top surface of the second epitaxial layer.

20 Claims, 42 Drawing Sheets

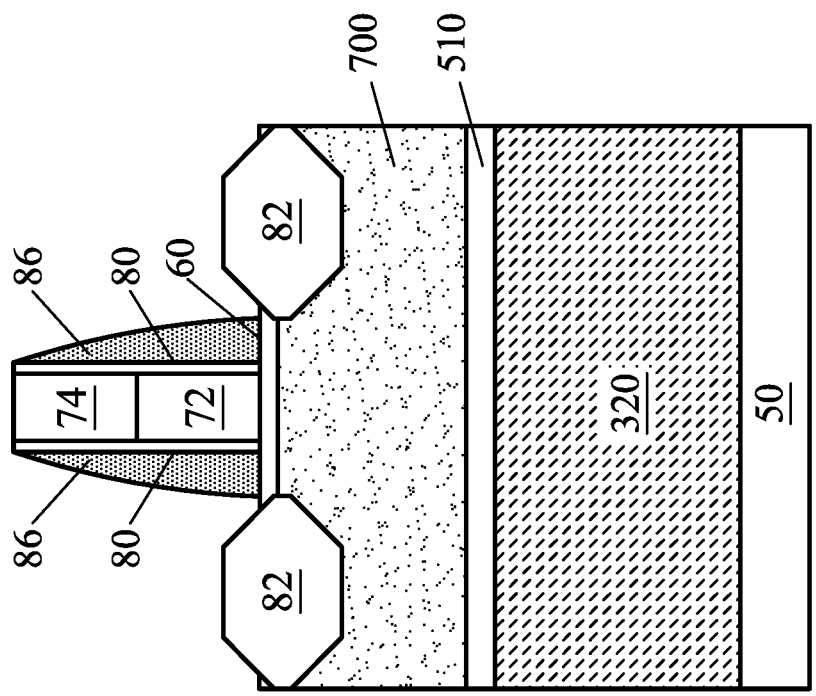
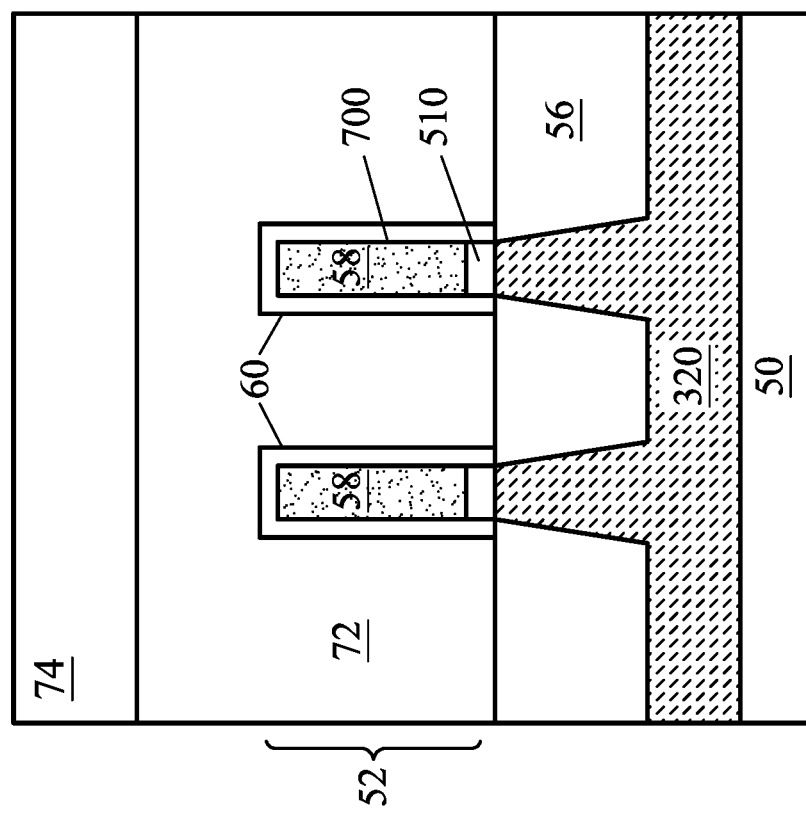
Figure 24A
Figure 24B

CMP PROCESS AND METHODS THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3, 4, 5, 6, 7, 8, 9, 10, 11A, 11B, 12, 13, 14, 15, 16, 17, 18, 19, 20A, 20B, 21A, 21B, 22A, 22B, 23A, 23B, 24A, 24B, 25A, 25B, 26A, 26B, 27A, 27B, 28A, 28B, 29A, 29B, 30A, 30B, 31A, 31B, 32A, 32B, 33A, 33B, 34A, 34B, 35A, 35B, 35C, 36A, 36B, 37A, 37B, 38A, 38B, 39A and 39B are cross-sectional views of intermediate stages in the manufacturing of FinFETs, in accordance with some embodiments.

DETAILED DESCRIPTION

Figure 1:
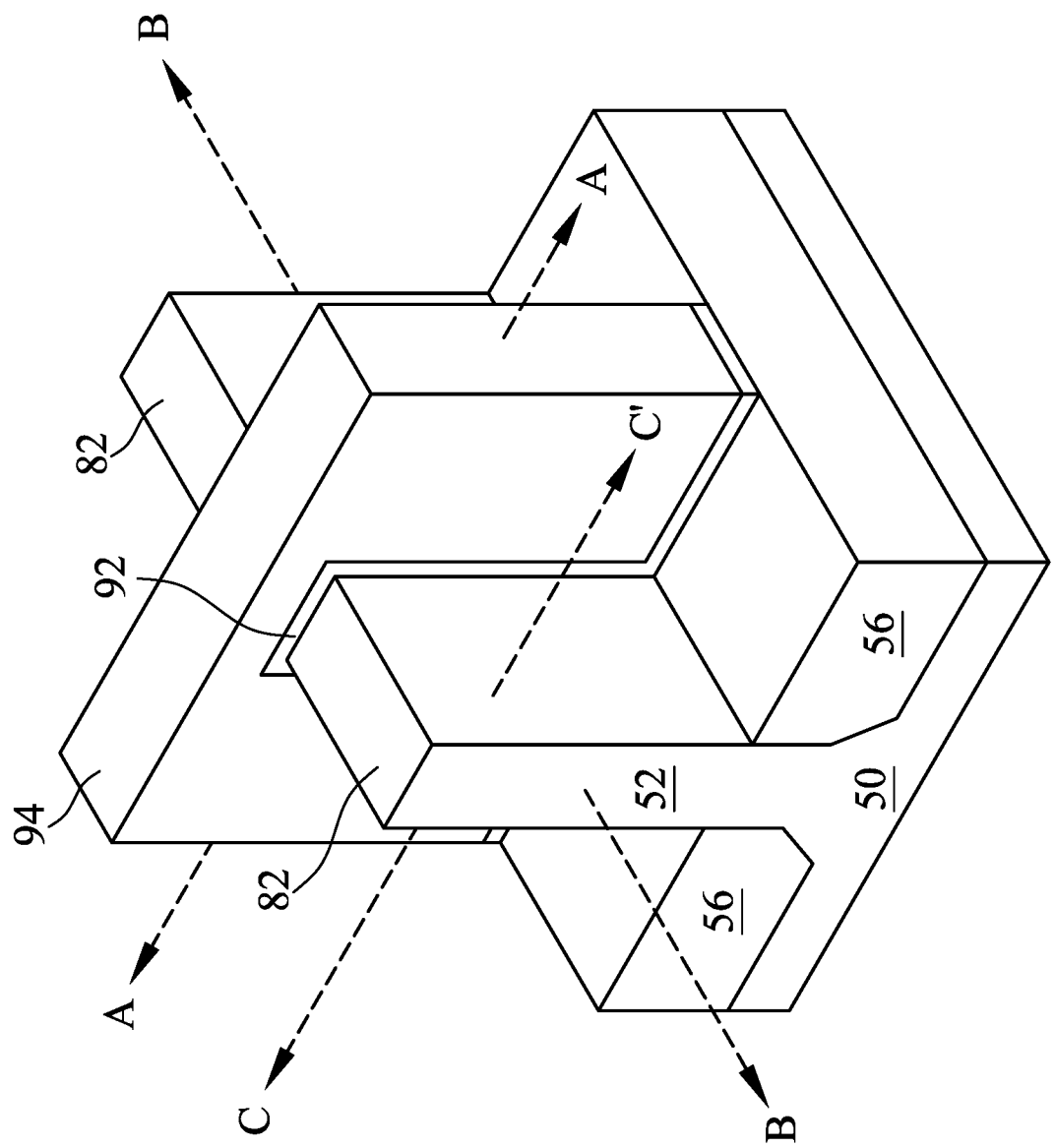
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments include methods applied to, but not limited to a wafer that includes a first epitaxial layer over a substrate. The wafer may include trenches that provide alignment marks. Various embodiments include depositing a hard mask layer over the first epitaxial layer and patterning the hard mask layer to form an opening. A recess is formed in the first epitaxial layer through the opening and a second epitaxial layer is deposited to fill the recess. The hard mask layer is then removed, and a chemical-mechanical polishing (CMP) process is subsequently performed to remove excess portions of the second epitaxial layer. Embodiments disclosed herein allow for a more balanced and uniform loading effect on top surfaces of the first epitaxial layer and the second epitaxial layer during the CMP process. As a result, a polish rate of the first epitaxial layer is closer to a polish rate of the second epitaxial layer during the CMP process. In addition, the hard mask layer is a potential scratch source during the CMP process and hence its removal prior to the CMP process leads to a reduction in a number of surface scratches on the top surfaces of the first epitaxial layer and the second epitaxial layer after the CMP process. These scratches may lead to undesirable effects during subsequent processes like fin damage on the outer perimeter of the wafer or patterning failures.

Various embodiments disclosed herein also include the use of a CMP slurry having a composition that allows for the easier removal of the slurry from the bottom of the alignment mark trenches and from the surfaces of the wafer. Slurry that remains unremoved (e.g., in the bottom of the alignment mark trenches and elsewhere on the wafer) may have undesirable effects, such as peeling on the outer perimeter of the wafer during a subsequent patterning process. These peeling defects may be formed from a film deposited over the unremoved slurry residue or defects. By using an embodiment CMP slurry, such peeling defects can be reduced. Embodiments disclosed herein also allow a top surface of the wafer to have a more uniform topography after the CMP process as well as allowing the outer perimeter of the wafer to have a reduced variation of the dimensions of the smallest geometrical features (critical dimension CD) upon further processing.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring isolation regions 56. Although the isolation regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring isolation regions 56.

A gate dielectric layer 92 is along sidewalls and over a top surface of the fin 52, and a gate electrode 94 is over the gate dielectric layer 92. Source/drain regions 82 are disposed in opposite sides of the fin 52 with respect to the gate dielectric layer 92 and gate electrode 94. FIG. 1 further illustrates reference cross-sections that are used in later figures. Cross-section A-A is along a longitudinal axis of the gate electrode 94 and in a direction, for example, perpendicular to the direction of current flow between the source/drain regions 82 of the FinFET. Cross-section B-B is perpendicular to cross-section A-A and is along a longitudinal axis of the fin 52 and in a direction of, for example, a current flow between the source/drain regions 82 of the FinFET. Cross-section C-C is parallel to cross-section A-A and extends through a source/drain region of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

FIGS. 3 through 11B and FIGS. 12 through 39B are cross-sectional views of intermediate stages in the manufacturing of FinFETs, in accordance with some embodiments. FIGS. 3 through 11A and FIGS. 12 through 19 illustrate reference cross-section A-A illustrated in FIG. 1, except for multiple fins/FinFETs. FIGS. 20A, 21A, 22A, 23A, 24A, 25A, 28A, 29A, 30A, 31A, 32A, 33A, 34A, 35A, 36A, 37A, 38A and 39A are illustrated along reference cross-section A-A illustrated in FIG. 1, and FIGS. 20B, 21B, 22B, 23B, 24B, 25B, 28B, 29B, 30B, 31B, 32B, 33B, 34B, 35B, 35C, 36B, 37B, 38B and 39B are illustrated along a similar cross-section B-B illustrated in FIG. 1, except for multiple fins/FinFETs. FIGS. 26A through 27B are illustrated along reference cross-section C-C illustrated in FIG. 1, except for multiple fins/FinFETs.

Figure 2:
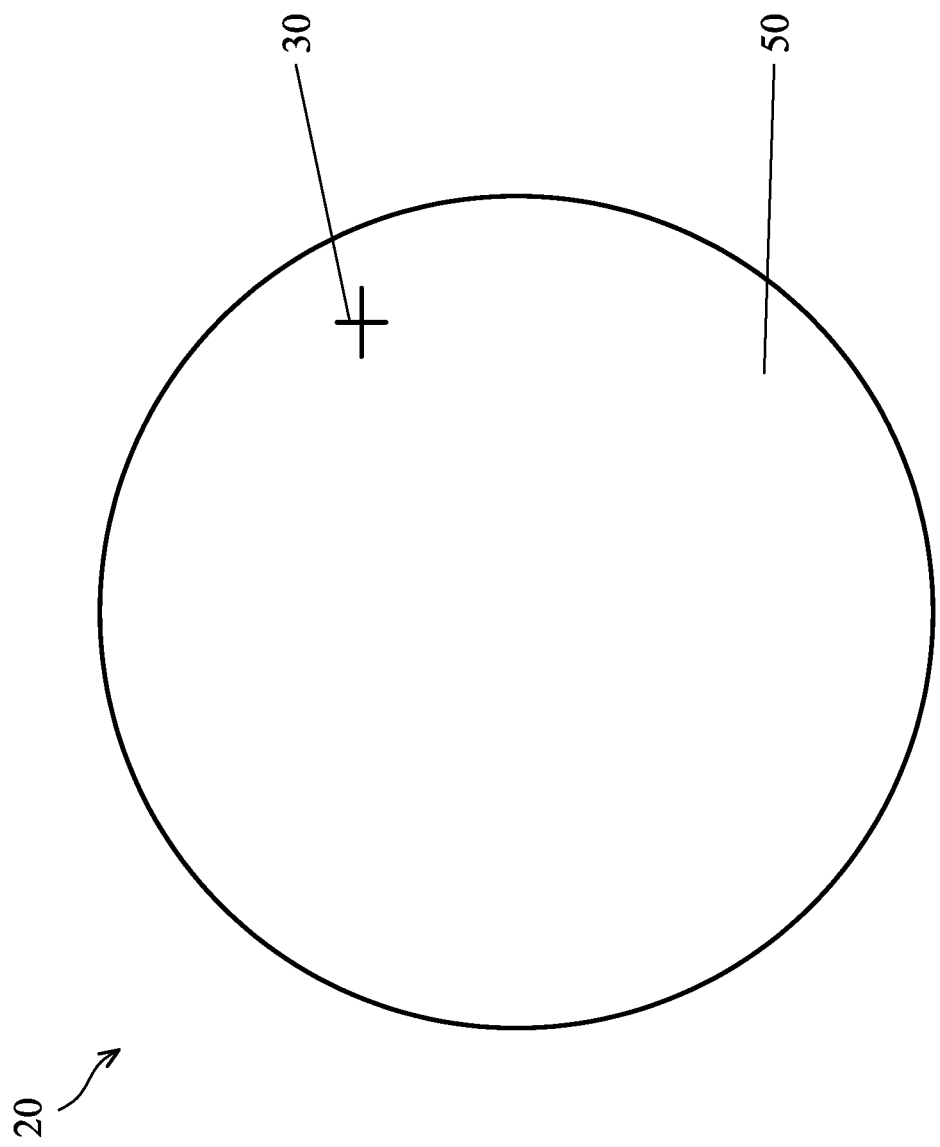
FIG. 2 illustrates a top view of a wafer, in accordance with some embodiments.

FIG. 2 shows a top view of a substrate 50 in the form of a bulk semiconductor wafer 20. In some embodiments, the substrate 50 can be a semiconductor on insulator (SOI) wafer. Further, substrate 50 can be made of silicon (Si) or another elementary semiconductor such as, for example, (i) germanium (Ge); (ii) a compound semiconductor including silicon germanium (SiGe), silicon carbide (SiC), gallium arsenide (GaAs), gallium phosphide (GaP), indium phosphide (InP), indium arsenide (InAs), and/or indium antimonide (InSb); (iii) an alloy semiconductor including silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof. For example purposes, the substrate 50 will be described in the context of silicon (e.g., single crystal). Based on the disclosure herein, other materials, as discussed above, can be used. These materials are within the spirit and scope of this disclosure.

The wafer 20 may be patterned to form alignment marks 30. Alignment marks 30 may comprise trenches etched into the wafer 20 that are patterned as geometrical shapes such as rectangles or crosses. Alignment marks 30 are used to align the wafer 20 such that subsequent layers are formed at the correct location relative to underlying features. Alignments marks 30 are subjected to the same process steps that the rest of the wafer 20 experiences. These process steps may include deposition of conductors and insulators, etching of the same, polishing, grinding, or the like as described in greater detail below.

Figure 3:
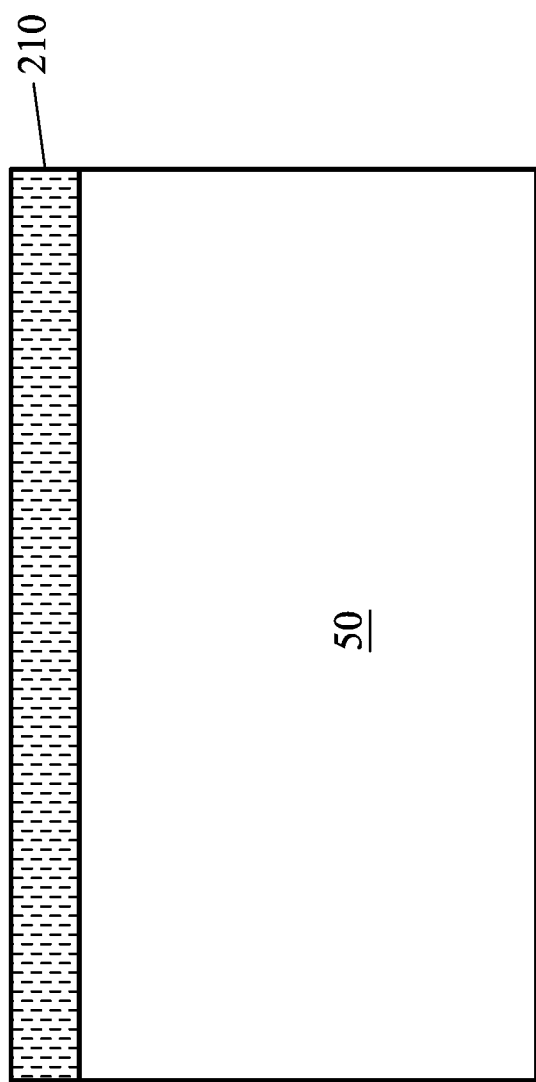

FIG. 3 is a cross-sectional view of a portion of the wafer 20 that shows the substrate 50 and references cross-section A-A illustrated in FIG. 1. A dielectric layer 210 is deposited on the substrate 50. The dielectric layer 210 may comprise a dielectric material, such as, silicon oxide, or the like. The dielectric layer 210 may be deposited or thermally grown according to acceptable techniques. In some embodiments, the dielectric layer 210 can have a thickness in a range from about 3 nm to about 15 nm. For example, surface damage to substrate 50 may occur during a subsequent implantation step (described in FIGS. 4 through 5) if the dielectric layer 210 has a thickness smaller than 3 nm, and an implant dopant depth may be too shallow during a subsequent implantation step (described in FIGS. 4 through 5) if the thickness of the dielectric layer 210 is larger than 15 nm. In accordance with some embodiments, the dielectric layer 210 can protect the top surface of the substrate 50 from contamination, prevent excessive damage to the substrate 50 during a subsequently performed ion implantation processes (e.g., as described in FIGS. 4-5, below), and can control the depth of dopants during the ion implantation processes.

Figure 4:
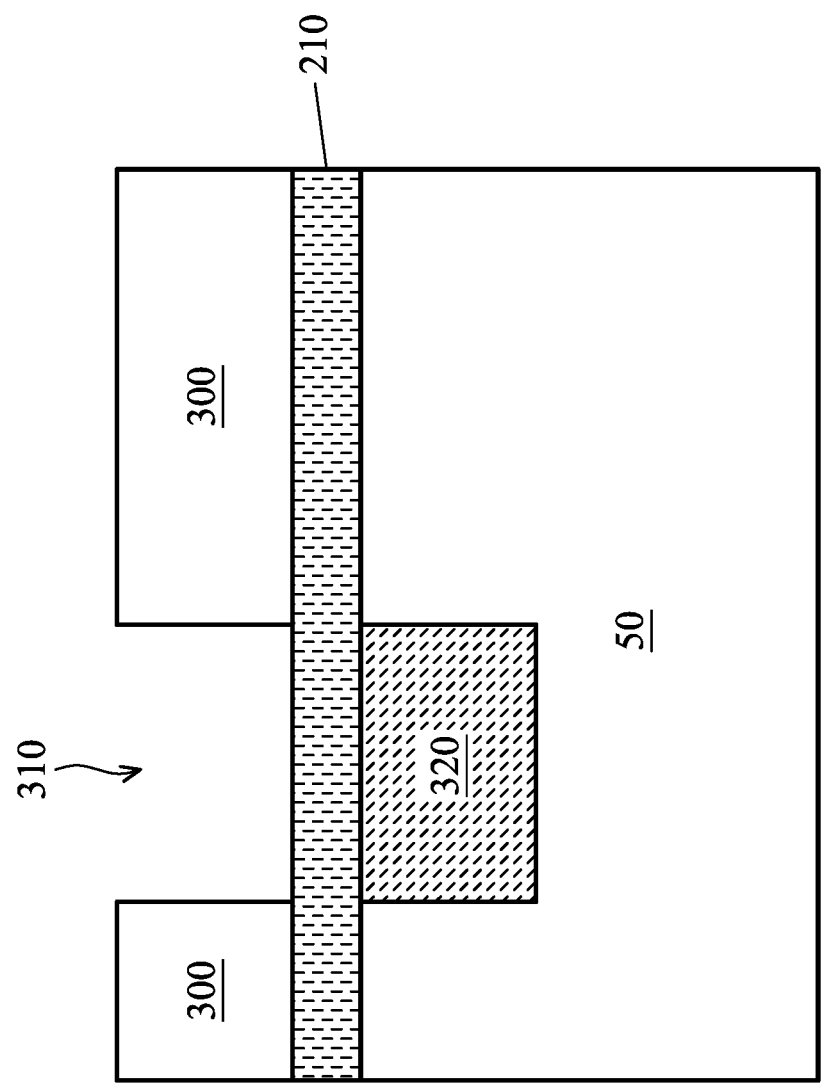

FIG. 4 illustrates the deposition of a photoresist layer 300 over the dielectric layer 210. After deposition, the photoresist layer 300 can be patterned so that an opening 310 is formed over a portion of the dielectric layer 210. Subsequently, an ion implantation is performed through the opening 310 to form, for example, an n-type region 320 in substrate 50. In some embodiments, n-type region 320 is substantially aligned to opening 310 because the photoresist layer 300 can act as an implant mask. In some embodiments, the n-type dopant may include arsenic (As), antimony (Sb), phosphorous (P), or the like. In some embodiments, the n-type dopant concentration in n-type region 320 is in a range from about $5\times10^{16}$ atoms/cm$^3$ to about $1\times10^{19}$ atoms/cm$^3$. N-type region 320 may have a depth of about 100 nm to about 500 nm. After the formation of n-type region 320, photoresist layer 300 can be removed.

Figure 5:
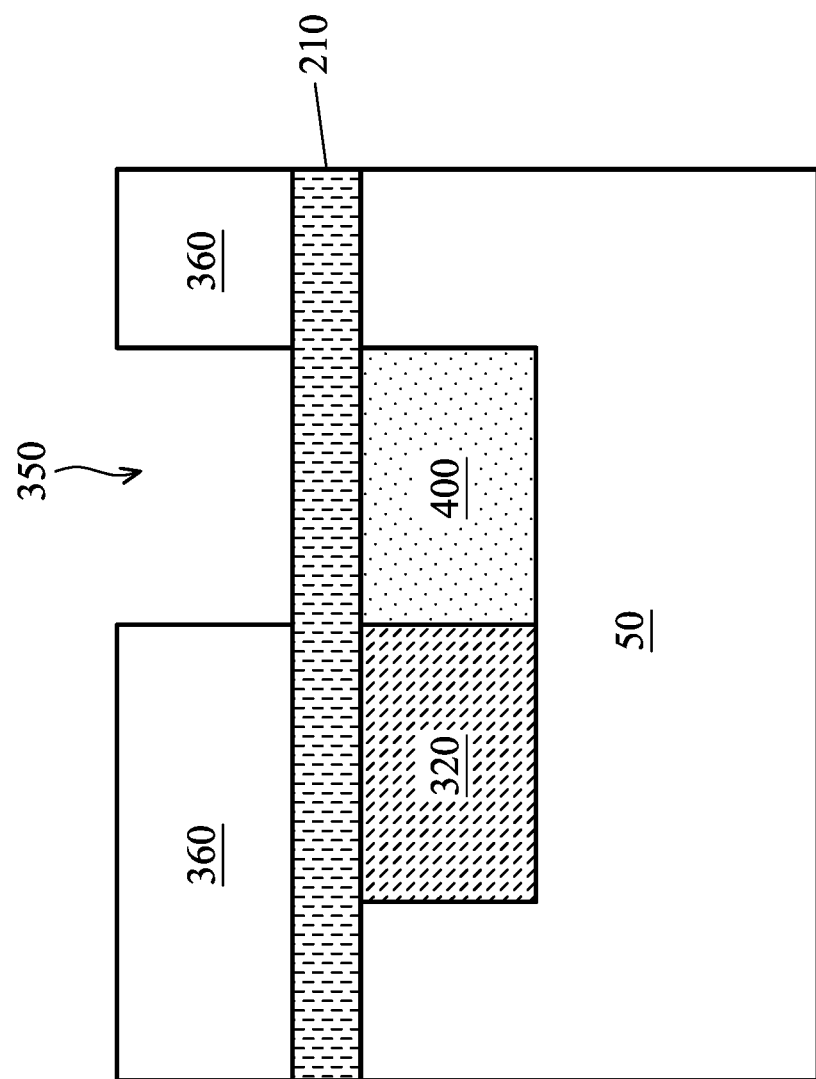

FIG. 5 illustrates the formation of a p-type region 400 in substrate 50 and adjacent to n-type region 320. First, a photoresist layer 360 is deposited and patterned over the dielectric layer 210, defining an opening 350 through the photoresist layer 360. In some embodiments, the p-type region can be created with an ion implantation process using a p-type dopant such as boron (B), or the like. In some embodiments, p-type region 400 can have a dopant concentration that is in a range from about $5\times10^{16}$ atoms/cm$^3$ to about $1\times10^{19}$ atoms/cm$^3$.

After the formation of n-type and p-type regions 320 and 400, any remaining photoresist layer can be removed with a wet clean process, an ashing process, or the like. In some embodiments, an annealing step is performed to electrically activate the dopants (e.g., move the dopants from interstitial sites to silicon lattice sites) and repair any silicon crystal damage which occurred during the ion implantation step. By way of example, crystal damage repair can occur at about 500° C. and dopant activation can occur at about 950° C. The annealing step can be performed in an annealing furnace or in a rapid thermal anneal (RTA) chamber. In accordance with some embodiments, the dielectric layer 210 can be removed after the dopant activation anneal.

Figure 6:
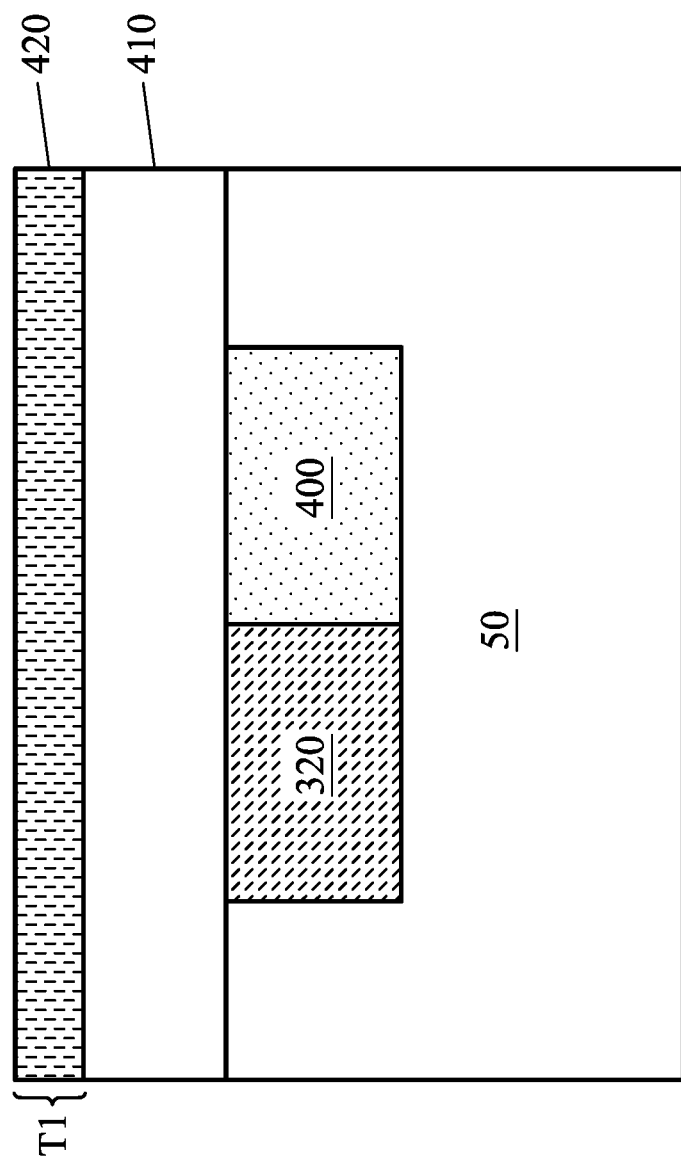

In FIG. 6, an epitaxial semiconductor layer 410 is formed on the substrate 50. The semiconductor layer 410 may comprise a semiconductor material, such as silicon, or the like. In some embodiments, the semiconductor layer 410 may have a thickness in a range from about 30 nm to about 100 nm. The semiconductor layer 410 may be deposited using a process such as chemical vapor deposition (CVD), or the like. Source gases for the semiconductor layer 410 formation may include silane ($SiH_4$), silicon tetrachloride ($SiCl_4$), trichlorosilane (TCS), dichlorosilane ($SiH_2Cl_2$ or DSC), or the like. Hydrogen ($H_2$) may be used as a reactant gas that reduces the aforementioned source gases. The deposition temperature during deposition of the semiconductor layer 410 can be in a range from about 700° C. to about 1250° C. depending on the gases used although other temperatures may be used in other embodiments. For example, source gases with fewer chlorine atoms (e.g., DSC) may require lower formation temperatures compared to source gases with more chlorine atoms, such as $SiCl_4$ or TCS.

A hard mask layer 420 may be formed on top of the semiconductor layer 410, according to some embodiments. The hard mask layer 420 may have a thickness T1 in a range from about 10 nm to about 50 nm. In some embodiments, the hard mask layer 420 may be an oxide layer such as $SiO_2$, or the like. Alternatively, the hard mask layer 420 may be a nitride layer, such as $Si_3N_4$, an oxynitride layer, or the like. The hard mask layer 420 may be deposited or thermally grown according to acceptable techniques.

Figure 7:
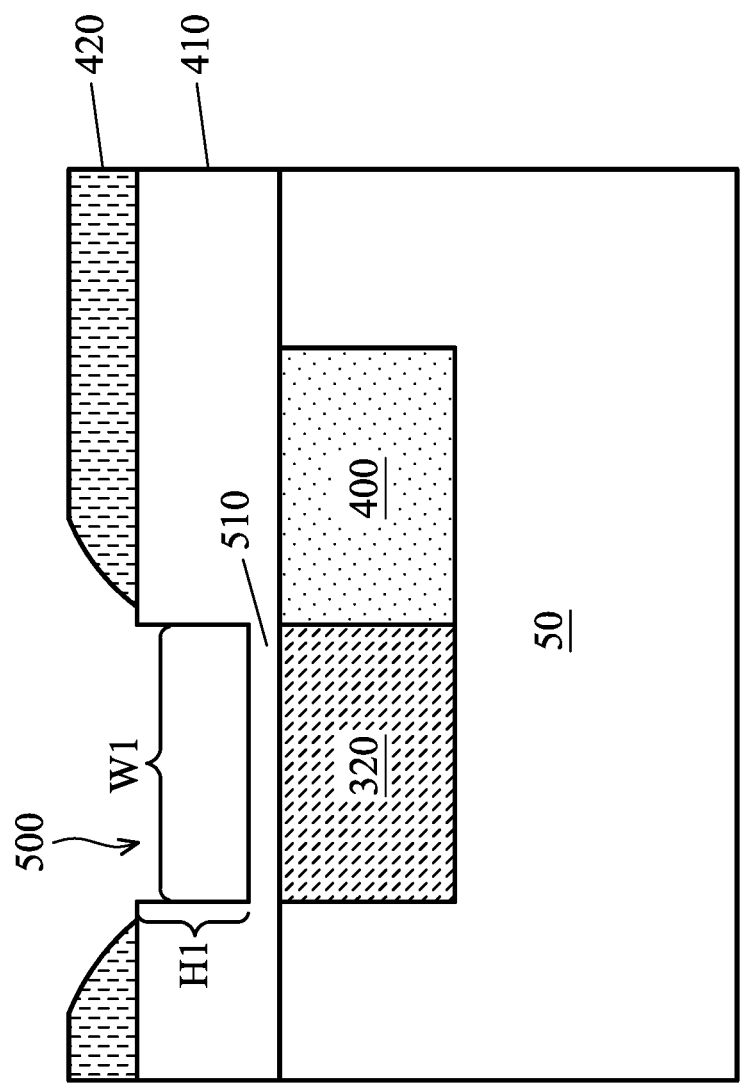

FIG. 7 illustrates the formation of the recess 500 in the semiconductor layer 410. In some embodiments, the recess 500 can be aligned to n-type region 320. Alignment of the recess 500 with n-type region 320 can be achieved, for example, through photolithography. For example, a photoresist may be deposited on the hard mask layer 420, which is then patterned to form openings. Patterning the photoresist may be performed using a combination of exposure, development, and/or cleaning processes. The pattern of the photoresist is then transferred to the hard mask layer 420. The hard mask layer 420 is then used a mask to define the recess 500. Transferring the pattern of the photoresist may be achieved using one or more dry and/or wet etch processes, or the like. For example, one or more plasma etching processes may be used to transfer the pattern of the photoresist to the hard mask layer 420 and the semiconductor layer 410 to define the recess 500. The one or more plasma etching processes may slightly etch the hard mask layer 420, which may widen the opening in the hard mask layer 420. Patterning the recess 500 in the semiconductor layer 410 can be timed so that a semiconductor region 510 of the semiconductor layer 410 is not removed. The region 510 may be disposed on top of n-type region 320. According to some embodiments, the thickness of the remaining semiconductor region 510 on top of n-type region 320 can range from about 5 nm to about 10 nm. In some embodiments, the etch processes can use different etch chemistries to etch the hard mask layer 420 and the semiconductor layer 410.

In some embodiments, the recess 500 has a width W1 and a height H1. The width W1 can be in a range from about 100 nm to about 500 nm and can be substantially equal (e.g., within manufacturing tolerances) to the width of n-type region 320. In some embodiments, the recess 500 can have a height H1 that is equal to the difference between the thickness of the semiconductor layer 410 and the thickness of the semiconductor region 510 at the bottom of the recess 500.

Figure 8:
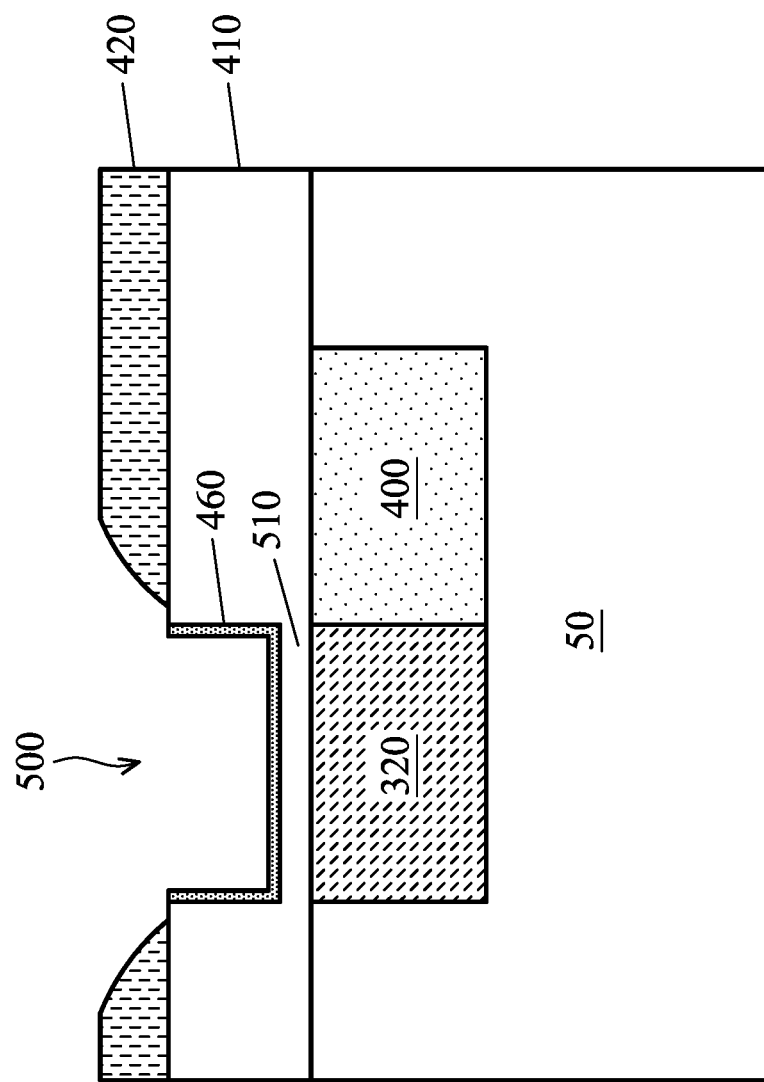

FIG. 8 illustrates the formation of a seed layer 460 on the exposed surfaces of the recess 500. According to some embodiments, the seed layer 460 cannot be grown on the hard mask layer 420; for example, the seed layer 460 cannot grow on $SiO_2$ or $Si_3N_4$. According to some embodiments, the seed layer 460 may be a Si layer, Si:C layer, a SiGe layer, or a combination thereof with a thickness that ranges from about 3 nm to about 10 nm. For example, the seed layer 460 can be Si/Si:C/SiGe, Si/SiGe, or Si:C/SiGe. According so some embodiments, the atomic percentage (at. %) of carbon dopant in Si:C can be from about 0.01 at. % to about 2 at. %. In some embodiments, the seed layer 460 is not sufficiently thick to fill the recess 500. As a result, the seed layer 460 covers the exposed surfaces of recess 500 and cannot fill the recess 500. The seed layer 460 can be deposited by a CVD process, or the like. For example, $SiH_4$, DCS, or a combination thereof can be used in the presence of $H_2$, $N_2$, or the like to form a seed layer 460 that comprises silicon. A combination of (i) $SiH_4$, disilane ($Si_2H_6$), germane ($GeH_4$), or hydrochloric acid (HCl), and (ii) $H_2$, $N_2$, He, Ar, or the like can be used to form a seed layer 460 that comprises silicon germanium.

Figure 9:
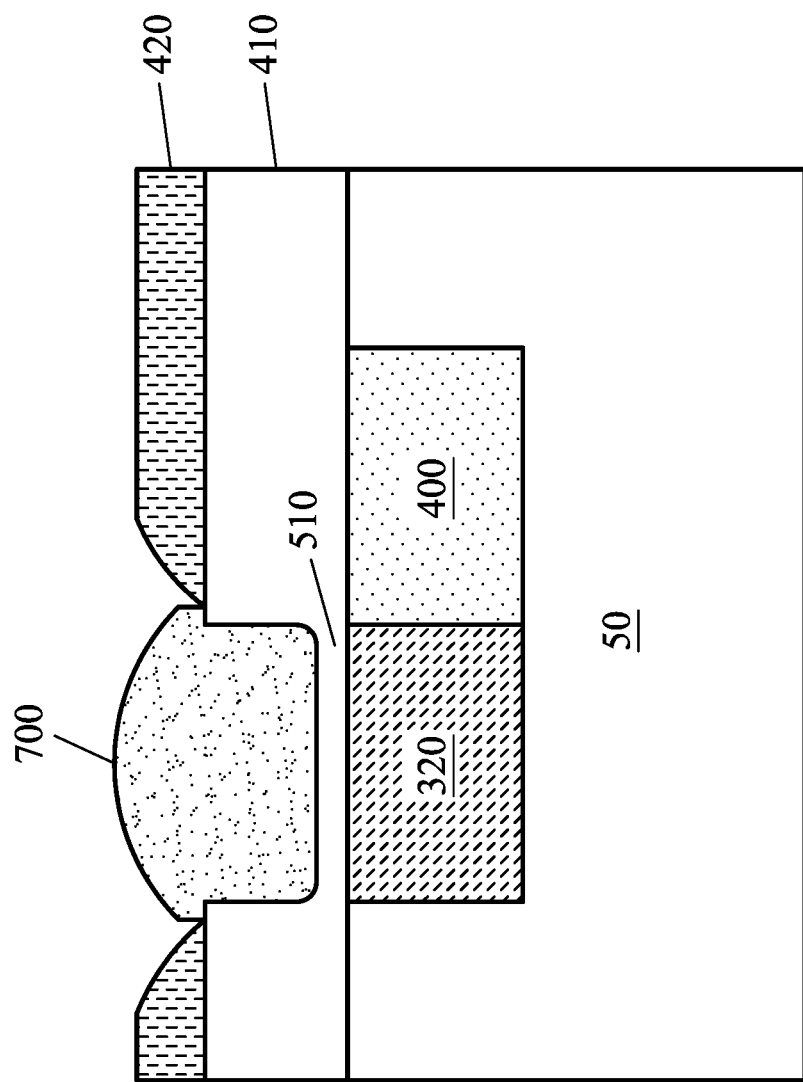

FIG. 9 illustrates the formation of an epitaxial layer 700 on the seed layer 460 to fill the recess 500. Precursor gases that can be used for the epitaxial layer 700 growth may include a combination of (i) $SiH_4$, $Si_2H_6$, $SiH_2Cl_2$, $GeH_4$, or HCl, and (ii) $H_2$, $N_2$, Ar, or the like. In some embodiments, the germanium concentration in atomic percentage (at. %) is constant throughout the thickness of the epitaxial layer 700 and can range from about 10 at. % to about 50 at. %. In some embodiments, the epitaxial layer 700 may include a first sub-layer that has a Ge concentration up to about 0~10 at. % and a second sub-layer with a constant Ge concentration throughout the thickness of the epitaxial layer 700 ranging from about 10 at. % to about 50 at. %. The thickness of the first sub-layer can range from about 2 nm to about 10 nm.

The epitaxial layer 700 may not grow on the hard mask layer 420. For example, the epitaxial layer 700, which comprises silicon germanium, does not generally grow on $SiO_2$ or $Si_3N_4$. According to some embodiments, the sidewalls of the recess 500, after the growth of epitaxial layer 700, can be substantially vertical in relation to the bottom surface of the recess 500; for example, the angle between the bottom surface of the recess 500 and a sidewall of the recess 500 can range from about 90° to about 100°. The epitaxial layer 700 may be strained and/or apply strain to the underlying semiconductor layer 410 due to the lattice mismatch between the material of the epitaxial layer 700 (e.g., silicon germanium) and the material of the semiconductor layer 410 (e.g., silicon). In subsequently process steps, portions of the epitaxial layer 700 and 410 may be patterned into channel regions of a PFET.

Figure 10:
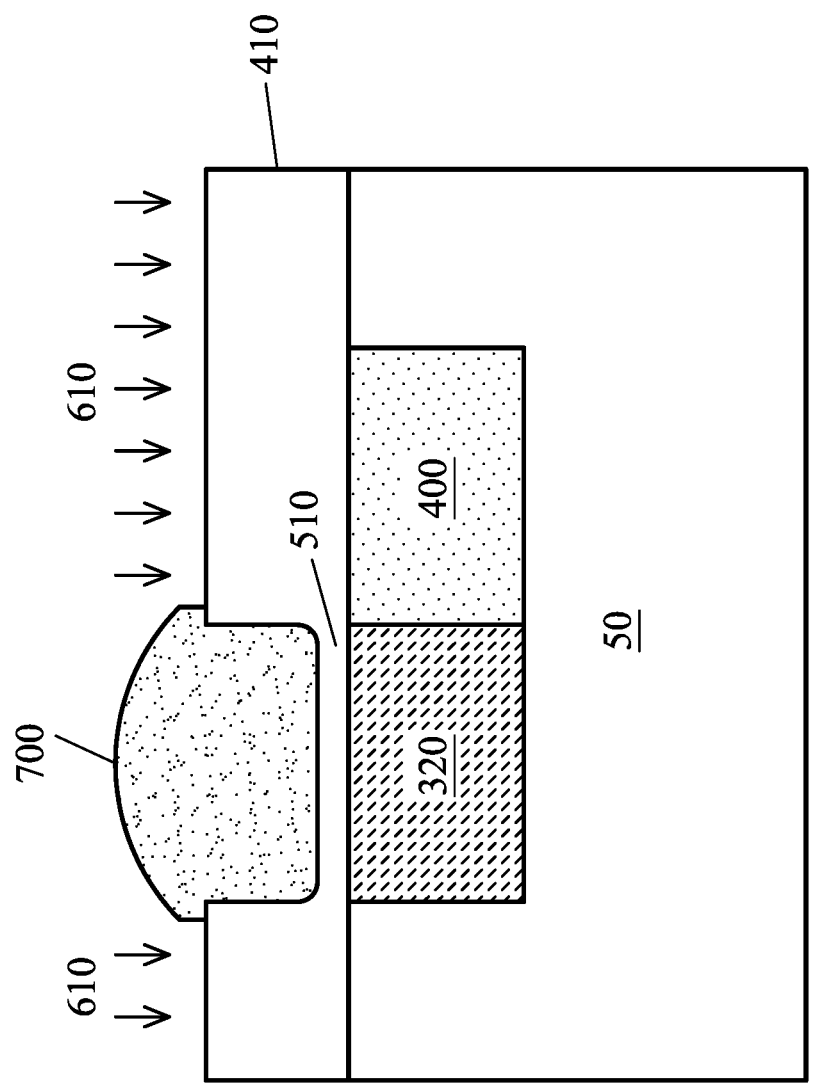

FIG. 10 illustrates the removal of the hard mask layer 420. In some embodiments, the hard mask layer 420 is removed by performing an etching process 610 using dilute hydrofluoric (dHF) acid, for example. In other embodiments, a different etchant may be used. The dHF acid (or other etchant) allows the hard mask layer 420 to be etched selective to the material of the semiconductor layer 410 and the epitaxial layer 700. Accordingly, the hard mask layer 420 can be removed without significantly attacking the underlying semiconductor layer 410 or the epitaxial layer 700.

Figure 11A:
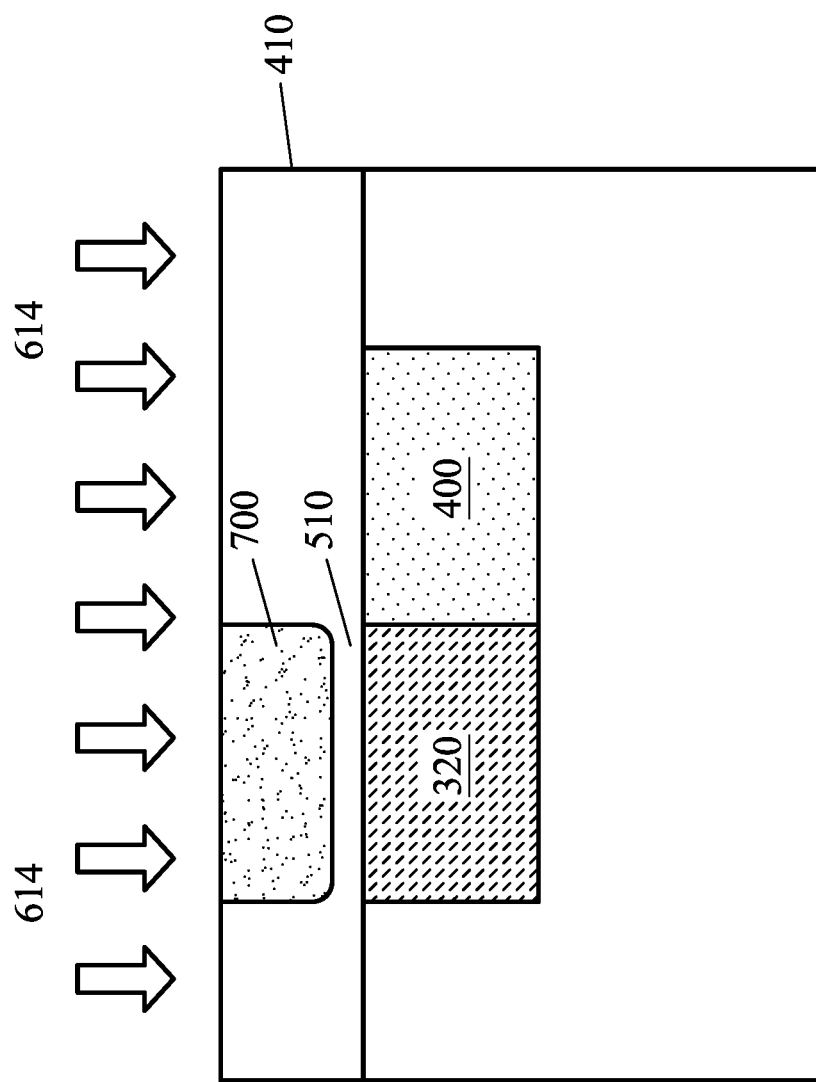
Figure 11B:
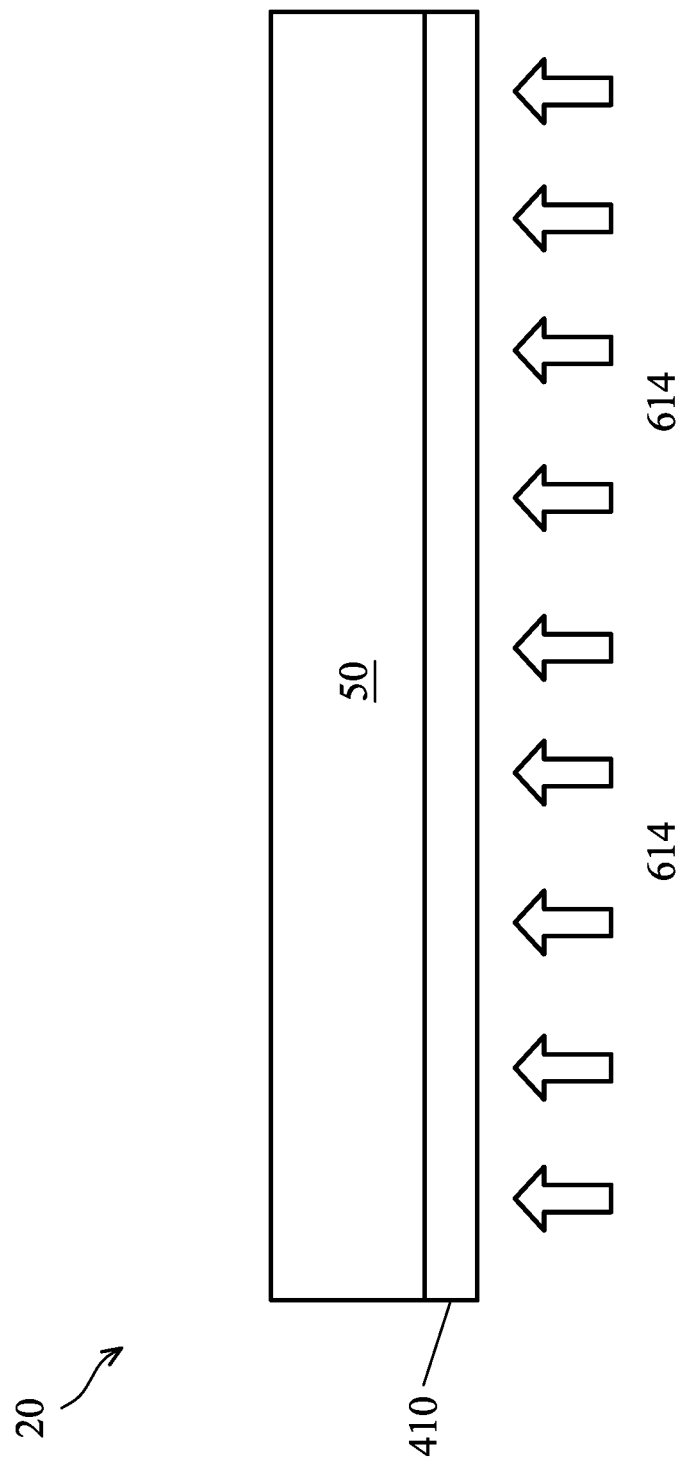

In FIGS. 11A and 11B, a CMP process 614 is performed to planarize the epitaxial layer 700 and the semiconductor layer 410. During the CMP operation a portion of the epitaxial layer 700 and the semiconductor layer 410 can be removed. After the CMP process 614, top surfaces of the semiconductor layer 410 and the epitaxial layer 700 are level as shown in FIG. 11A. Because the hard mask layer 420 was removed (shown previously in FIG. 10) before CMP process 614 was performed, a more balanced and uniform loading effect on top surfaces of the epitaxial layer 700 and the semiconductor layer 410 is possible during the CMP process 614. This allows a polish rate of the epitaxial layer 700 to be closer to a polish rate of the semiconductor layer 410 during the CMP process 614. In addition, the hard mask layer 420 is a potential scratch source during the CMP process 614 and hence its removal (shown previously in FIG. 10) prior to CMP process 614 leads to a reduction in a number of surface scratches on the top surfaces of the epitaxial layer 700 and the semiconductor layer 410 after the CMP process 614. For example, the top surface of the wafer 20 may have $4\times10^1$ or fewer surface scratches after the CMP process 614.

FIG. 11B illustrates a cross-sectional view of wafer 20. In FIG. 11B the epitaxial layer 700 and the semiconductor layer 410 are planarized by performing the CMP process 614. The CMP process 614 may use an abrasive material in a reactive chemical CMP slurry in conjunction with a polishing pad to polish the wafer 20. The wafer 20 is positioned such that surfaces of epitaxial layer 700 and the semiconductor layer 410 that are to be polished face in a direction (for example, downward) towards the polishing pad that is below the wafer 20. A downward force or pressure is applied urging the wafer 20 into contact with the polishing pad. The wafer 20 is rotated over the polishing pad during the chemical mechanical planarization process, thereby imparting mechanical abrading action to affect planarization or polishing of a contacting surface of the wafer 20. The CMP slurry may have a composition that allows for the easier removal of the slurry from the bottom of the trenches of alignment mark 30 and from the surfaces of the wafer 20. Slurry that remains unremoved (e.g., in the bottom of the trenches of alignment mark 30 and elsewhere on the wafer 20) may have undesirable effects such as peeling on the outer perimeter of the wafer 20 during a subsequent patterning process. These peeling defects may be formed from a film deposited over the unremoved slurry residue or defects. This is because the portions of film deposited on the slurry residue or defects may be unstable due to the underlying slurry residue or defects.

The CMP slurry may comprise various elements that are used to tune the CMP polish rate and adjust loading effect during the CMP process 614. The CMP slurry may comprise an abrasive that has a concentration in a range from about 0.5 to about 1.5 percent by weight (wt %), where the abrasive may have a mean abrasive size in a range from about 25 nm to about 45 nm. A higher abrasive concentration may result in a higher CMP polish rate. The CMP slurry may have a pH that may be in a range from 0 to 9 and may comprise an inorganic pH adjustor. The pH value may be used to adjust the polish rate on each of the epitaxial layer 700 and the semiconductor layer 410 to obtain substantially flat surfaces. The CMP slurry may also comprise a polymer Si suppressor, such as, polyethylene glycol (PEG), or the like. A concentration of the polymer Si suppressor may be in a range of about 10 percent to about 40 percent. The Si suppressor may help selectively decrease the Si removal rate compared to the removal rate of other elements during the CMP process. In addition, the CMP slurry may also comprise a polymer SiGe inhibitor that may include polyethylene glycol (PEG), or the like, that is present at a concentration in a range from about 10 percent to about 40 percent. The CMP slurry may comprise an enhancer that increases a rate of material removal during the planarization. The enhancer may comprise lactic acid, acetic acid, formic acid, citric acid, oxalic acid, or the like, that is present at a concentration in a range from about 5 percent to about 35 percent.

By using a CMP slurry that has the above composition during the CMP process 614, the removal of the slurry from the bottom of the trenches of alignment mark 30 and from the surfaces of the wafer 20 after the CMP process 614 is made easier. This reduces a number of peeling defects formed during a subsequent patterning process. This is because slurry that remains unremoved (e.g., in the bottom of the trenches of alignment mark 30 and elsewhere on the wafer 20) may have undesirable effects such as peeling on the outer perimeter of the wafer 20 during the subsequent patterning process. These peeling defects may be formed from a film deposited over the unremoved slurry residue or defects. This may be as a result of the portions of film deposited on the slurry residue or defects being unstable due to the underlying slurry residue or defects.

The CMP process 614 removes material and tends to even out irregular topography, making a polished surface of the wafer 20 flat or substantially planar (e.g., within manufacturing tolerances). For example, after the CMP process 614, a polished top surface at the outer perimeter of the wafer 20 is at a level substantially close to a level of the polished top surface at the center of the wafer 20. After the CMP process 614 is complete, a difference between a highest point of the polished surface of wafer 20 and the lowest point of the polished surface of wafer 20 may be up to 12 nm or higher. In addition, the CMP process 614 allows the outer perimeter of the wafer 20 to have a reduced variation of the dimensions of the smallest geometrical features (critical dimension CD) after further processing steps are carried out. Further, by combining the removal of the hard mask layer 420 (shown previously in FIG. 10) prior to the CMP process 614 and the use of the CMP slurry during the CMP process 614, a sensitivity of the CMP process 614 to polishing time may be reduced.

After the CMP process 614, a wet clean is performed to remove any remaining slurry particles and residue on wafer 20. After the wet clean, a total of up to $8\times10^2$ slurry particles may remain unremoved at the bottom of the trenches of alignment mark 30.

Figure 11C:
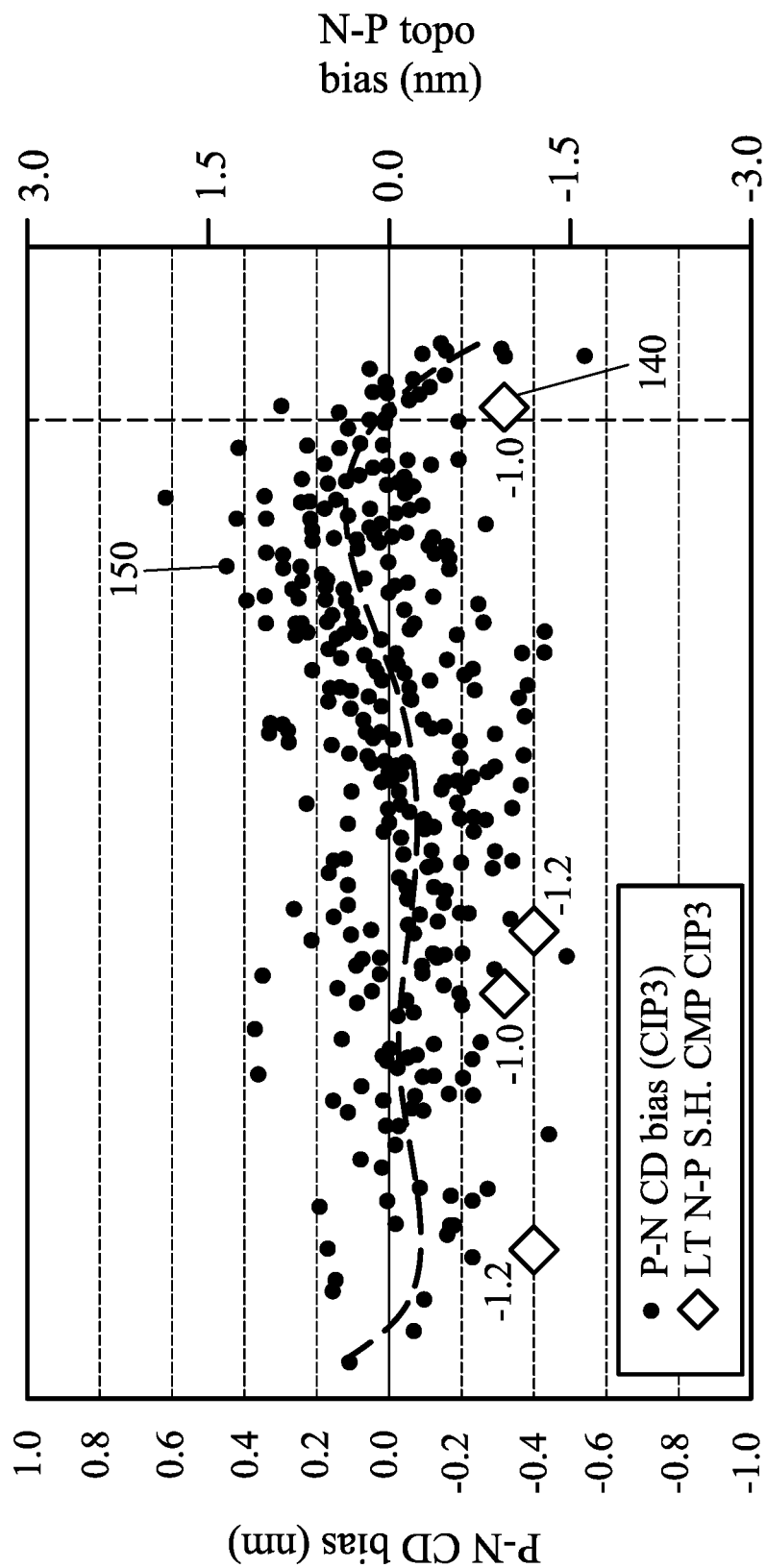
FIG. 11C shows a difference in topography versus wafer radius trace after a CMP process and a difference in dimensions of the smallest geometrical features versus wafer radius trace after a CMP process, in accordance with some embodiments.

FIG. 11C illustrates traces 140 and 150 indicating data measured after the CMP process 614 is complete. Trace 140 shows a difference in height (y-axis scale on right) between a polished top surface of the epitaxial layer 700 and a polished top surface of the semiconductor layer 410 along different radial positions of the wafer 20. The radial position goes from "0" mm on the x-axis which corresponds to the center of wafer 20 to "150" mm which corresponds to the edge of wafer 20. After CMP process 614 is complete, a number of subsequent processing steps are performed. Trace 150 shows a difference (y-axis scale on the left) between dimensions of the smallest geometrical features (critical dimension CD) on the epitaxial layer 700 and the dimensions of the smallest geometrical features on the semiconductor layer 410 along different radial positions of the wafer 20 after the number of subsequent processing steps are performed on wafer 20. Traces 140 and 150 show that as a result of CMP process 614, the polished top surface of the wafer 20 has a more uniform topography from the center of wafer 20 to the outer perimeter of wafer 20. In addition, the outer perimeter of the wafer 20 has a reduced variation of the dimensions of the smallest geometrical features (critical dimension CD) upon further processing. Accordingly, critical dimension (CD) uniformity in the wafer 20 is improved through the use of an embodiment CMP slurry.

Figure 12:
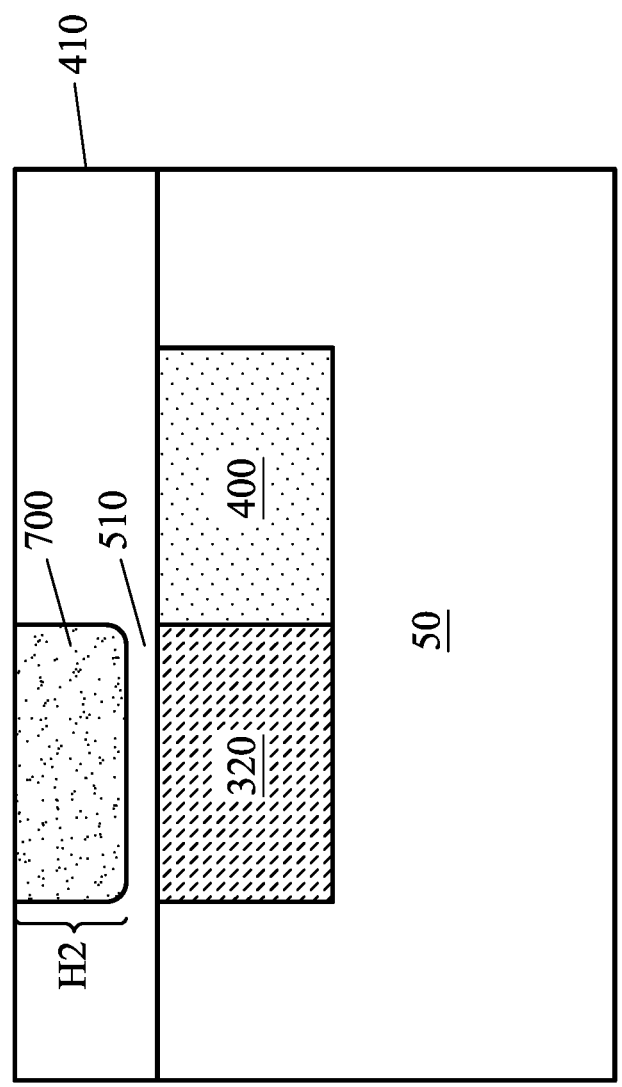

FIG. 12 illustrates a cross-sectional view of a portion of the wafer 20 after the CMP process 614 is complete. After the CMP process 614, polished top surfaces of the semiconductor layer 410 and the epitaxial layer 700 are level. The polished top surface of the epitaxial layer 700 has a height H2 above a top surface of the n-type region 320. The height H2 may be in a range from about 30 nm to about 80 nm. The polished top surface of the semiconductor layer 410 may be at the same height H2 above a top surface of the p-type region 400. For example, a height H2 that is larger than 80 nm may result in a larger number of induced dislocation defects in the epitaxial layer 700, and a height H2 that is smaller than 30 nm will result in subsequently formed FinFETs (described in FIGS. 38A through 39B) having insufficient channel volumes that will negatively impact device performance.

Figure 13:
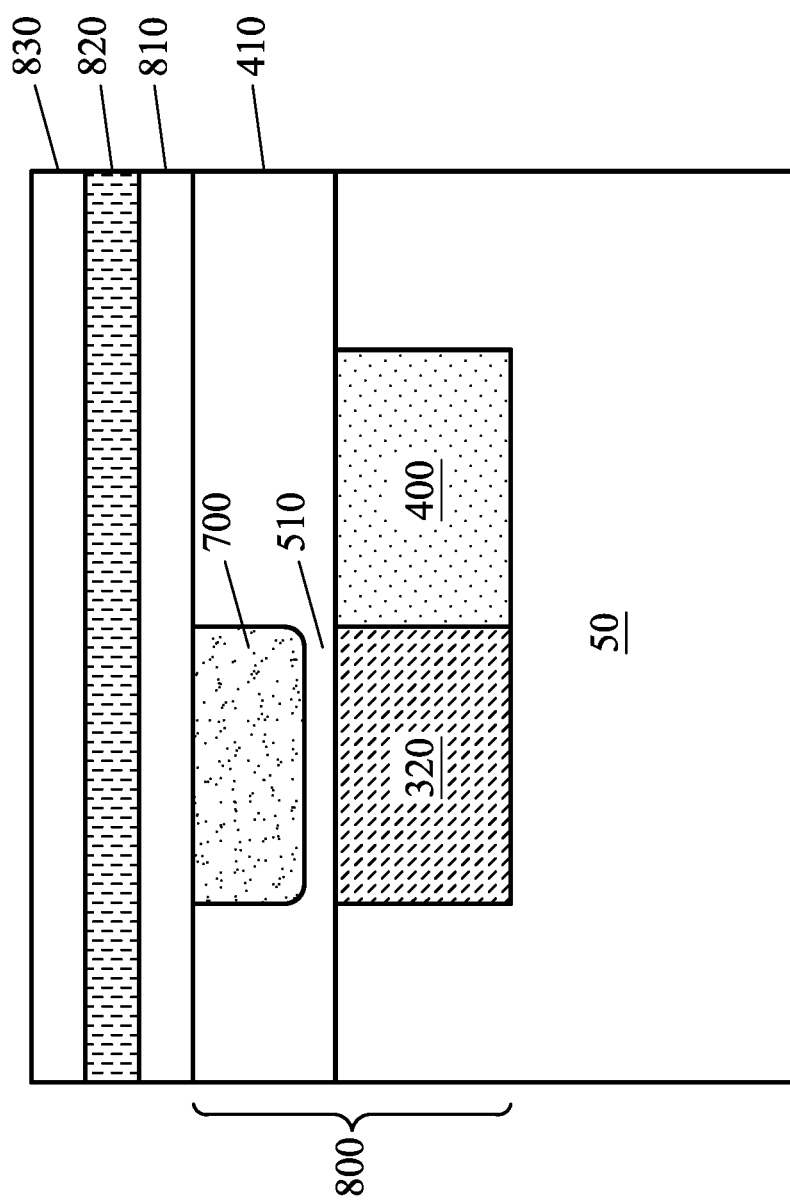

FIG. 13 illustrates the deposition of a semiconductor layer 810 over the planarized surfaces of the epitaxial layer 700 and the semiconductor layer 410. The semiconductor layer 810 may comprise a semiconductor material, such as silicon, or the like. In some embodiments, the thickness of the semiconductor layer 810 can range from about 1 nm to about 10 nm, and can be grown with similar methods used to grow semiconductor layer 410. Subsequently, a dielectric layer 820 and a dielectric layer 830 can be deposited over the semiconductor layer 810. The dielectric layer 820 may comprise a dielectric material, such as, silicon oxide, or the like. The dielectric layer 820 may be deposited or thermally grown according to acceptable techniques. The dielectric layer 830 may comprise a dielectric material, such as, silicon nitride, or the like, that may be deposited by a CVD process, or the like. The semiconductor layer 810, the dielectric layer 820, and the dielectric layer 830, can protect the epitaxial layer 700 and the semiconductor layer 410 during subsequent etch processes.

Figure 14:
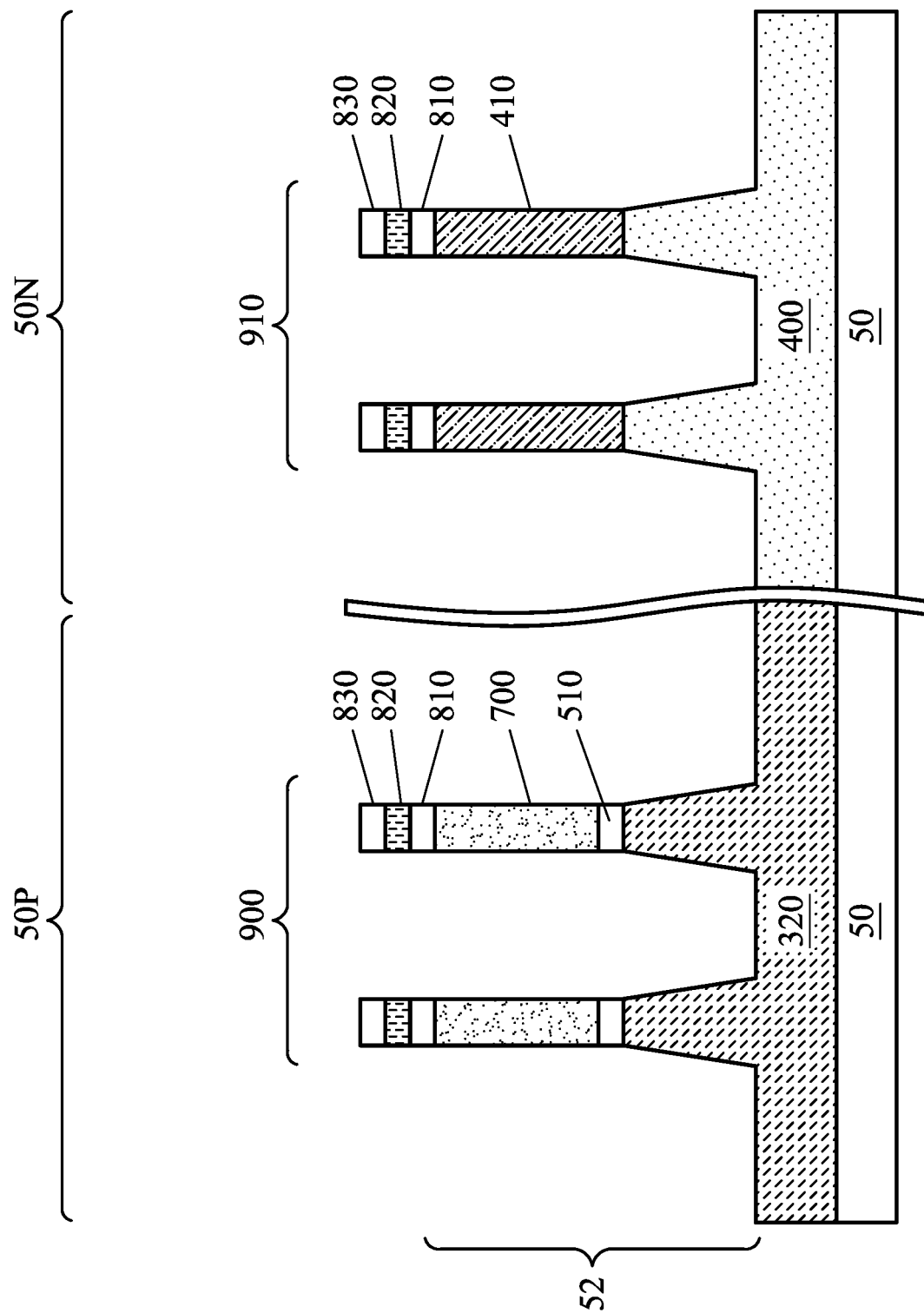

FIG. 14 illustrates portions of the stack 800 (as shown in FIG. 13) being etched to form fins 52, which can include a bottom section made of the n-type region 320, a middle section made of the semiconductor region 510, and top section made of the seed layer 460 and the epitaxial layer 700, according to some embodiments. In some embodiments, fins 52 can also be formed to include a bottom section made of p-type region 400 and a top section made of the semiconductor layer 410. FIG. 14 also illustrates a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P (as illustrated by divider 51), and any number of device features (e.g., other active devices, doped regions, isolation structures, etc.) may be disposed between the region 50N and the region 50P.

The fins 52 may be patterned by any suitable method. For example, the fins 52 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over dielectric layer 830 and patterned using a photolithography process. Spacers are formed alongside the patterned sacrificial layer using a self-aligned process. The sacrificial layer is then removed, and the remaining spacers may then be used to pattern the fins.

According to some embodiments, a fin structure 900 can include a bottom section of the n-type region 320, a middle section of the semiconductor region 510, and a top section of the seed layer 460 and epitaxial layer 700. A fin structure 910 can include a bottom section made of the p-type region 400 and a top section made of semiconductor layer 410. The number of fins 52 in the fin structure 900 and the fin structure 910 are exemplary and not limiting. Therefore, fewer or additional fins may be possible depending on the fin pitch and the desired width of each fin.

Figure 15:
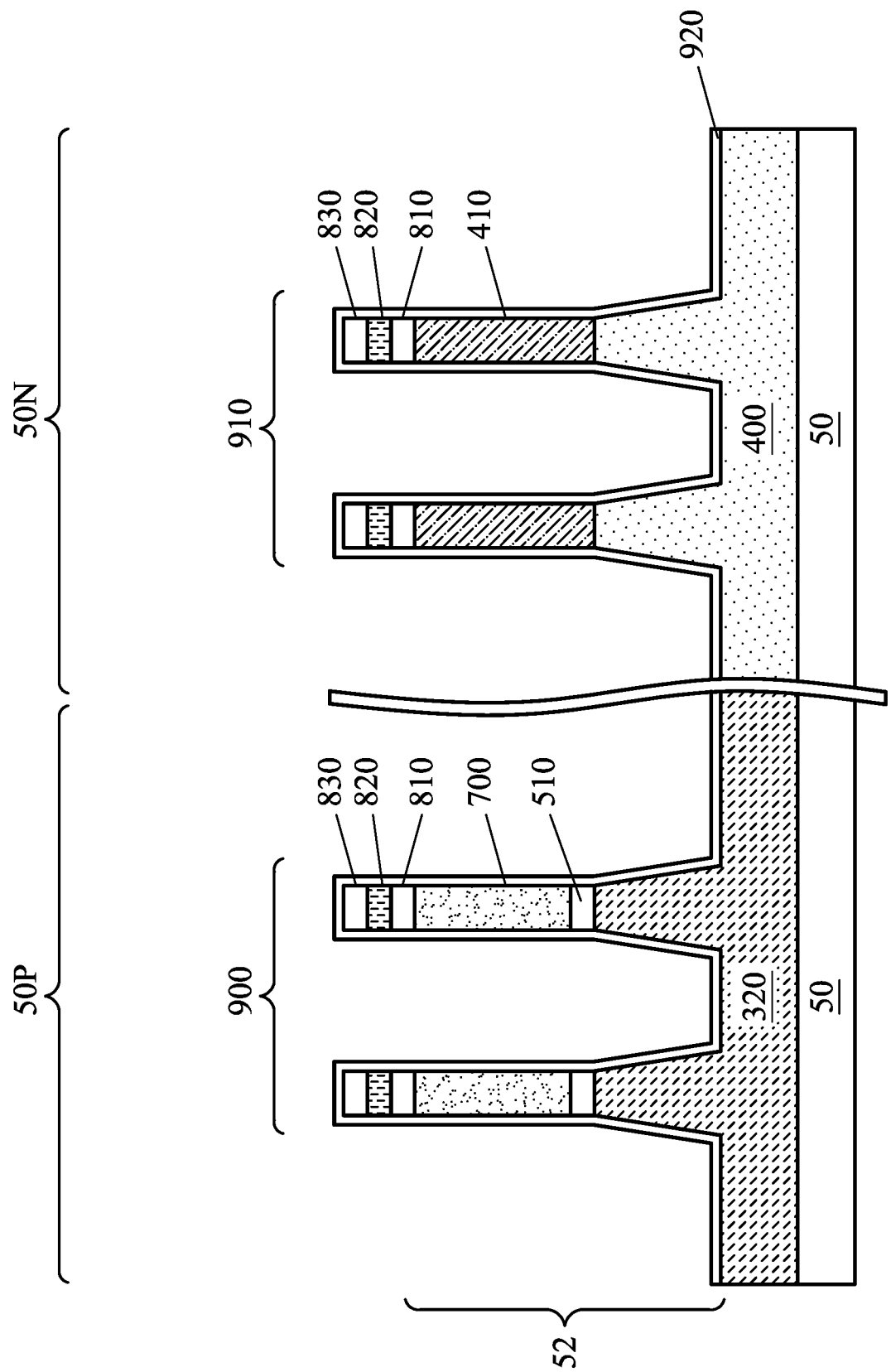

FIG. 15 illustrates the deposition of a dielectric liner 920 over the fin structure 900 and the fin structure 910 to cover the sidewall surfaces of the fin structure 900, the fin structure 910, and horizontal surfaces of p-/n-type regions 400 and 320. The dielectric liner 920 can be, for example, silicon nitride, or the like. The dielectric liner can be formed by a CVD process, or the like. In some embodiments, the dielectric liner 920 can provide structural support to the fin structure 900 and the fin structure 910 during subsequent processing.

Figure 16:
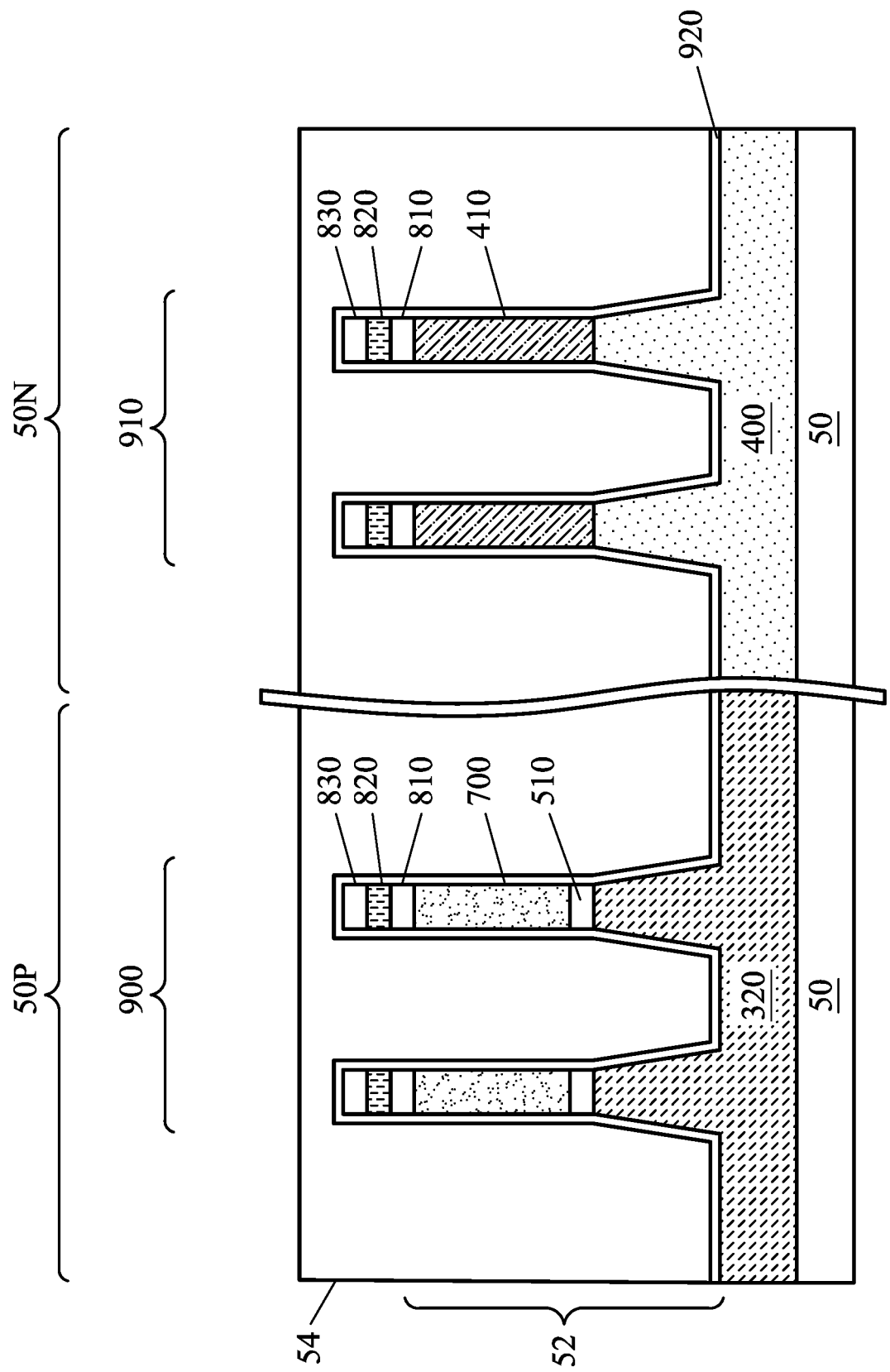

FIG. 16 illustrates an insulation material 54 being formed over the fin structure 900 and the fin structure 910 to fill the space between the fins 52. The insulation material 54 may be an oxide, such as silicon oxide, a nitride, the like, or a combination thereof, and may be formed by a high density plasma chemical vapor deposition (HDP-CVD), a flowable CVD (FCVD) (e.g., a CVD-based material deposition in a remote plasma system and post curing to make it convert to another material, such as an oxide), the like, or a combination thereof. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52, the semiconductor layer 810, the dielectric layer 820, and the dielectric layer 830. Although the insulation material 54 is illustrated as a single layer, some embodiments may utilize multiple layers. For example, in some embodiments a liner (not shown) may first be formed along a surface of the p-/n-type regions 400 and 320 and the fins 52. Thereafter, a fill material, such as those discussed above may be formed over the liner.

Figure 17:
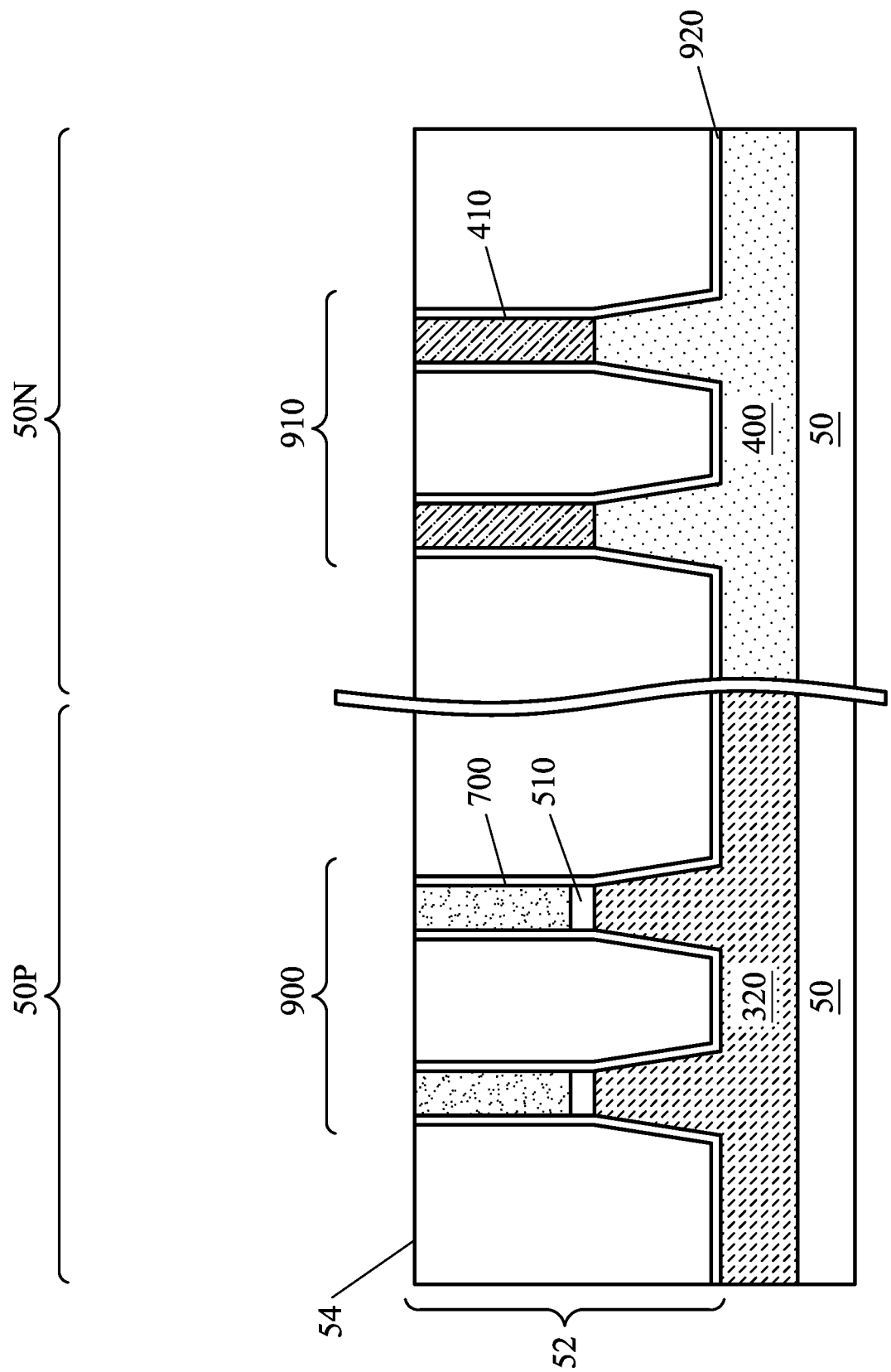

FIG. 17 illustrates a CMP process to remove a portion of insulation material 54 over the fin structure 900 and the fin structure 910. In addition, the semiconductor layer 810, the dielectric layer 820, and the dielectric layer 830 may also be removed. In some embodiments, the CMP process can stop on the dielectric liner 920. In addition, the dielectric liner 920 can also be recessed to the level of insulation material 54.

Figure 18:
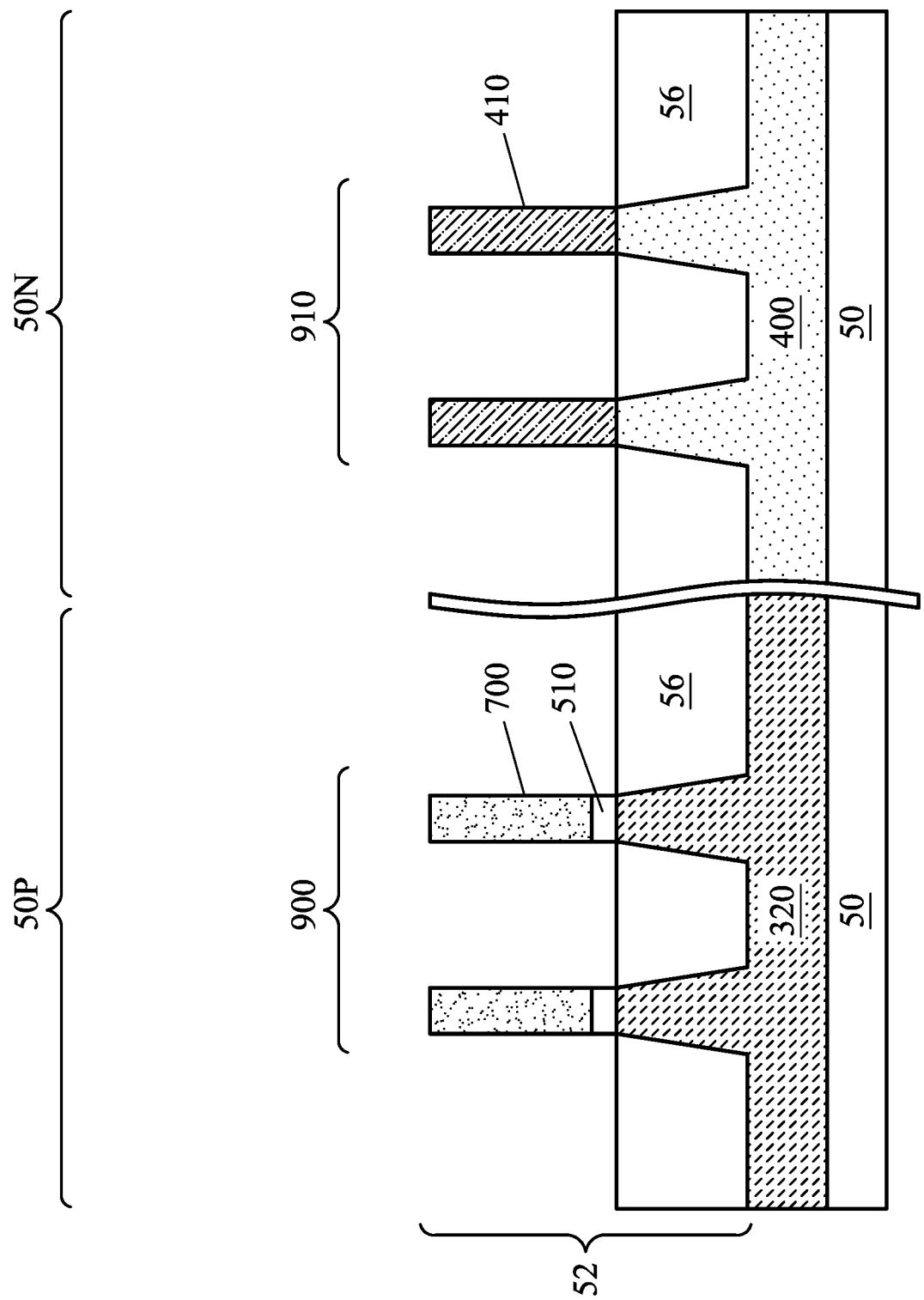

FIG. 18 illustrates subsequent etchback processes that recess insulation material 54 at the level of n- and p-type regions 320 and 400. The insulation material 54 is recessed to form Shallow Trench Isolation (STI) regions 56. The insulation material 54 is recessed such that upper portions of fins 52 in the region 50N and in the region 50P protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

In alternate embodiments, a strained channel in an n-type Fin Field-Effect Transistor (NFET) can be fabricated in region 50N over p-type region 400. For example, this can be accomplished by forming fins 52 in the fin structure 910 that comprise an epitaxial layer of carbon doped silicon (Si:C) that is grown on a silicon seed layer.

Further in FIG. 18, appropriate wells (not shown) may be formed in the fins 52. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, BF$_2$, or the like implanted in the region to a concentration of equal to or less than $10^{18}$ cm$^{-3}$, such as between about $10^{17}$ cm$^{-3}$ and about $10^{18}$ cm$^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

Figure 19:
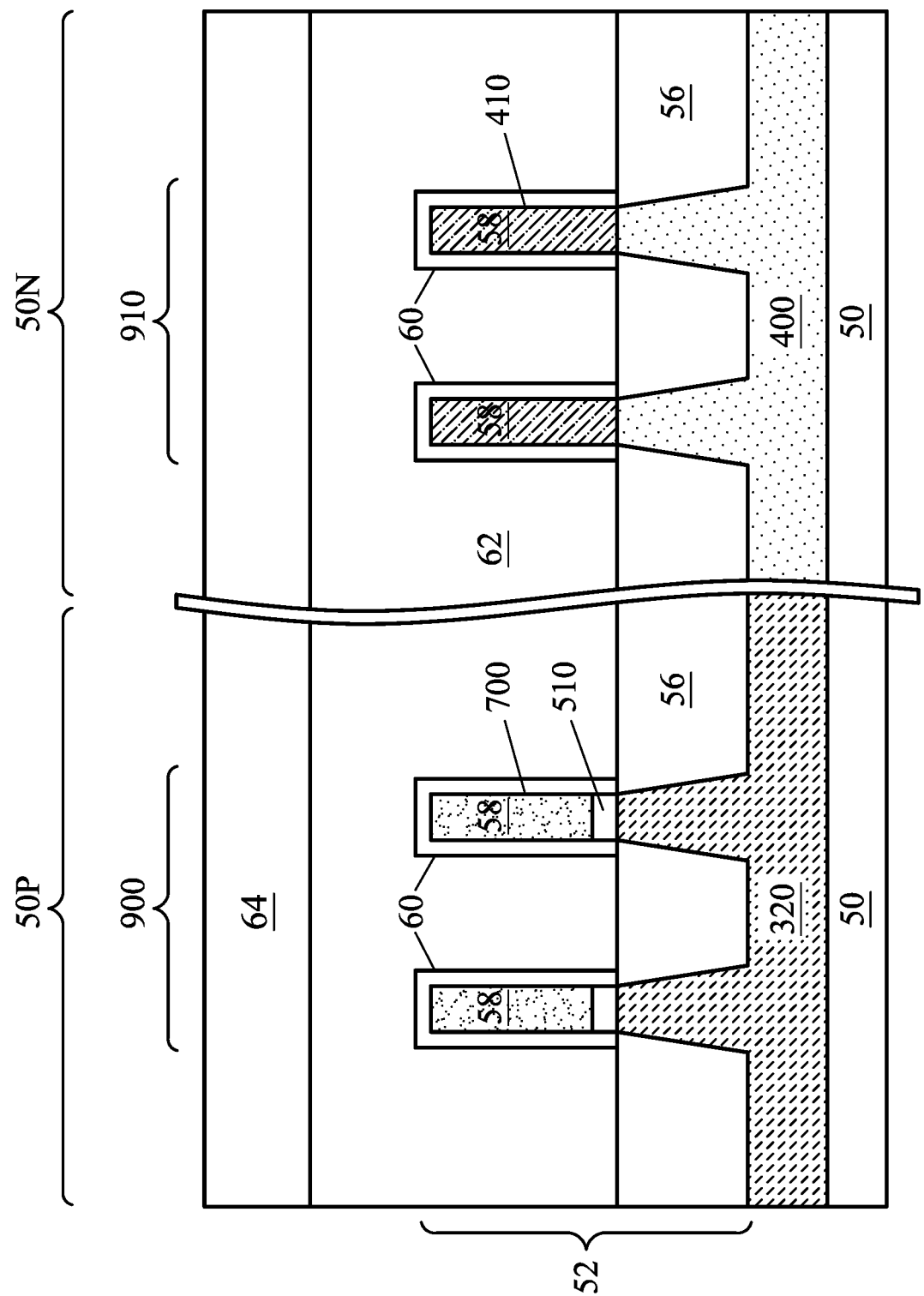

In FIG. 19, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. A dummy gate layer 62 is formed over the dummy dielectric layer 60, and a mask layer 64 is formed over the dummy gate layer 62. The dummy gate layer 62 may be deposited over the dummy dielectric layer 60 and then planarized, such as by a CMP. The mask layer 64 may be deposited over the dummy gate layer 62. The dummy gate layer 62 may be a conductive material and may be selected from a group including polycrystalline-silicon (polysilicon), poly-crystalline silicon-germanium (poly-SiGe), metallic nitrides, metallic silicides, metallic oxides, and metals. In one embodiment, amorphous silicon is deposited and recrystallized to create polysilicon. The dummy gate layer 62 may be deposited by physical vapor deposition (PVD), CVD, sputter deposition, or other techniques known and used in the art for depositing conductive materials. The dummy gate layer 62 may be made of other materials that have a high etching selectivity from the etching of isolation regions. The mask layer 64 may include, for example, SiN, SiON, or the like. In this example, a single dummy gate layer 62 and a single mask layer 64 are formed across the region 50N and the region 50P. In some embodiments, separate dummy gate layers may be formed in the region 50N and the region 50P, and separate mask layers may be formed in the region 50N and the region 50P. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

Figure 20B:
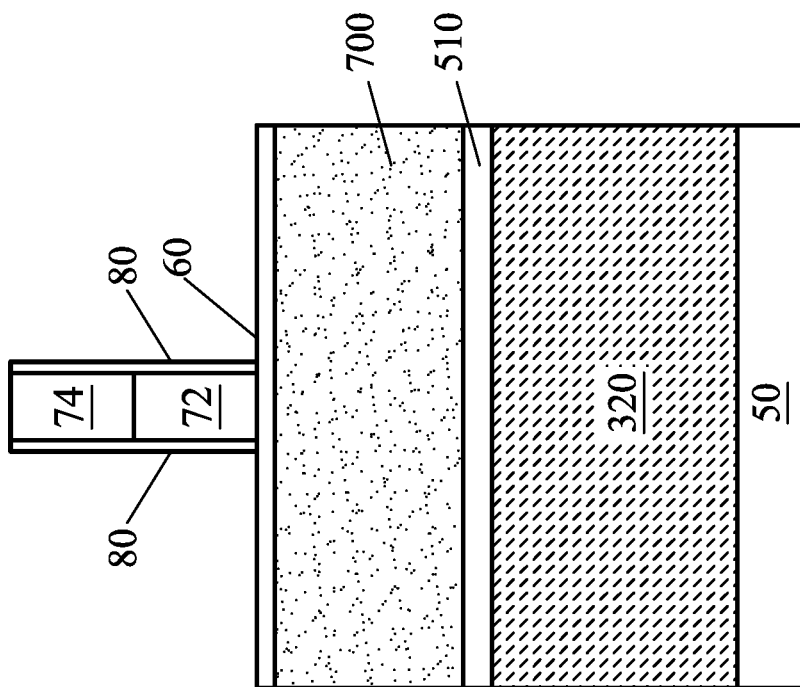
Figure 20A:
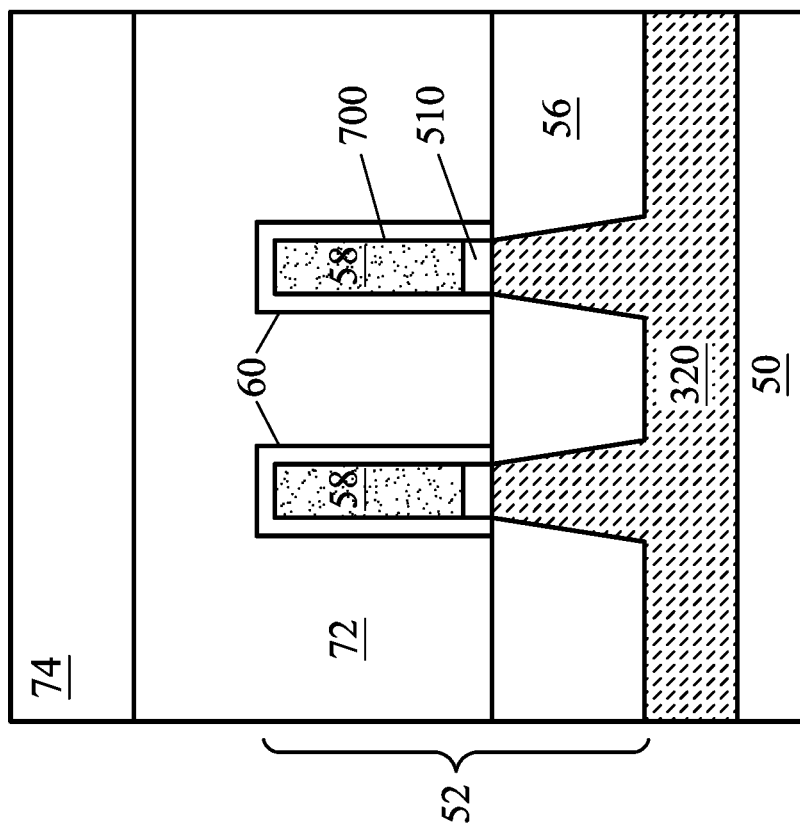
Figure 21B:
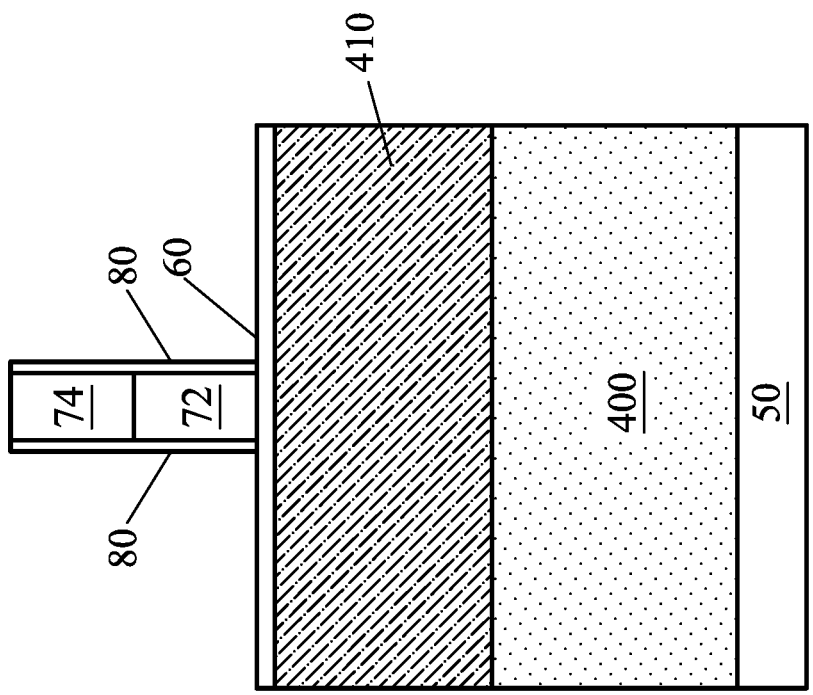
Figure 21A:
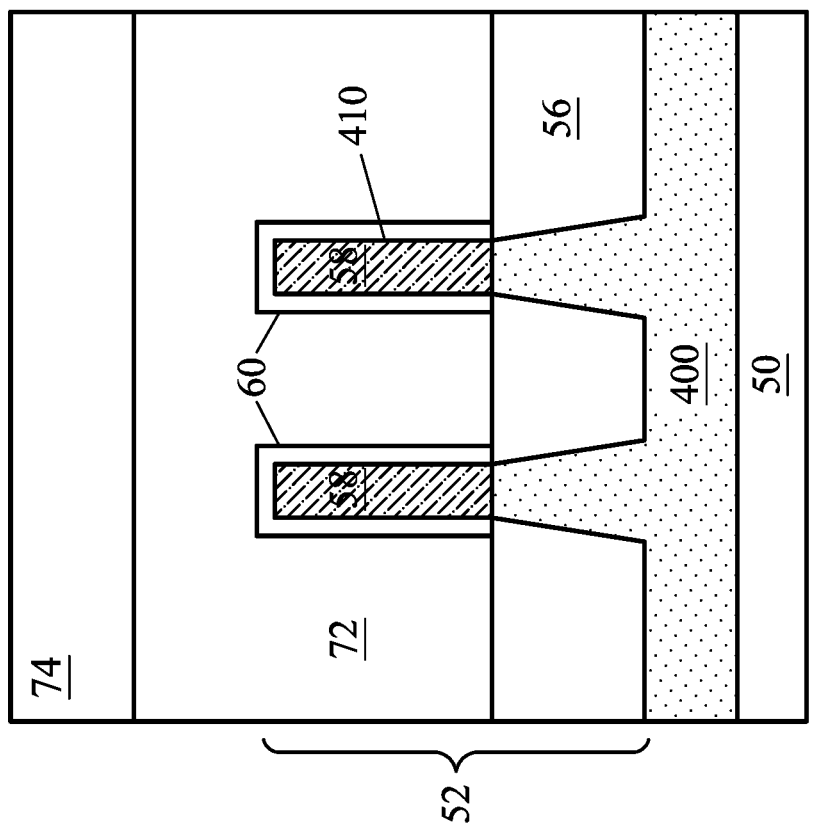

FIGS. 20A through 39B illustrate various additional steps in the manufacturing of embodiment devices. FIGS. 20A and 20B illustrate features in region 50P, and FIGS. 21A and 21B illustrate features in region 50N. In FIGS. 20A through 21B, mask layer 64 may be patterned using acceptable photolithography and etching techniques to form masks 74. The pattern of the masks 74 then may be transferred to the dummy gate layer 62. In some embodiments (not illustrated), the pattern of the masks 74 may also be transferred to the dummy dielectric layer 60 by an acceptable etching technique to form dummy gates 72. The dummy gates 72 cover respective channel regions 58 of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Further in FIGS. 20A through 21B, gate seal spacers 80 can be formed on exposed surfaces of the dummy gates 72, the masks 74, and/or the fins 52. A thermal oxidation or a deposition followed by an anisotropic etch may form the gate seal spacers 80.

After the formation of the gate seal spacers 80, implants for lightly doped source/drain (LDD) regions (not explicitly illustrated) may be performed. In the embodiments with different device types, similar to the implants discussed above in FIG. 18, a mask, such as a photoresist, may be formed over the region 50N, while exposing the region 50P, and appropriate type (e.g., n-type or p-type) impurities may be implanted into the exposed fins 52 in the region 50P. The mask may then be removed. Subsequently, a mask, such as a photoresist, may be formed over the region 50P while exposing the region 50N, and appropriate type impurities may be implanted into the exposed fins 52 in the region 50N. The mask may then be removed. The n-type impurities may be the any of the n-type impurities previously discussed, and the p-type impurities may be the any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Figure 22B:
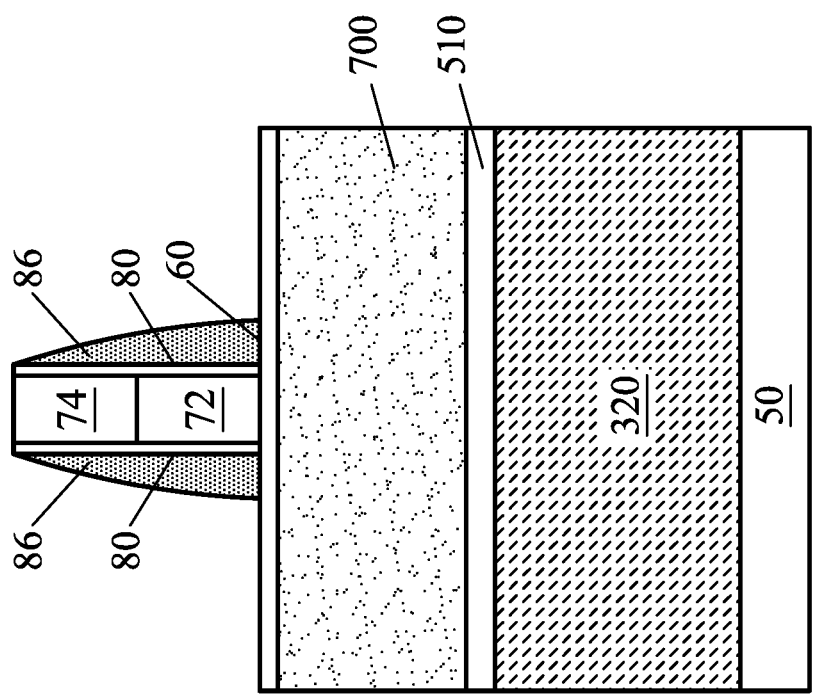
Figure 22A:
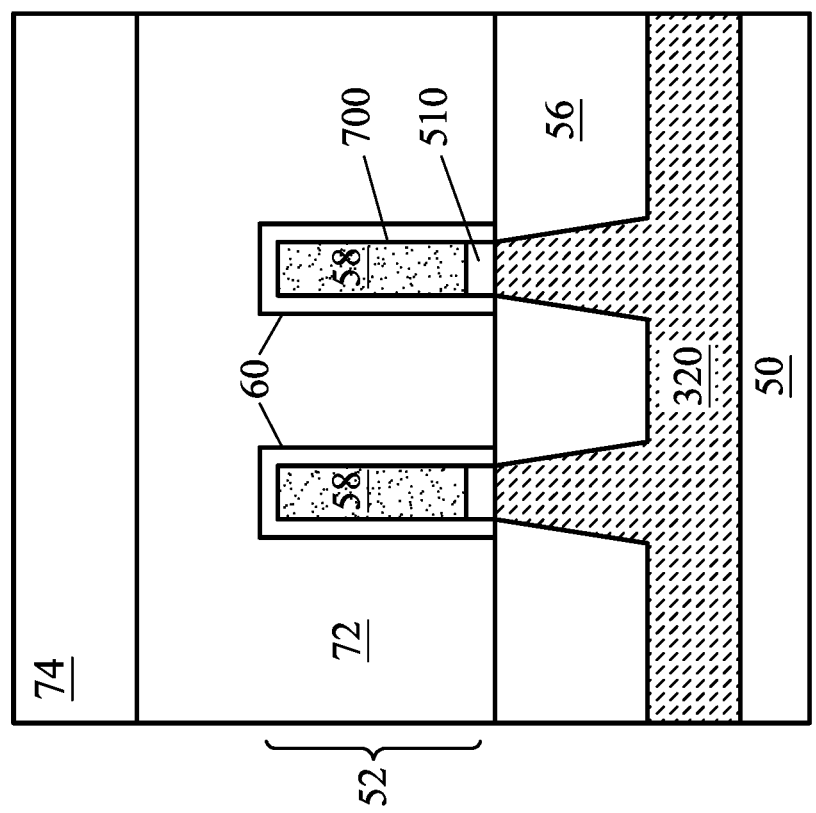
Figure 23B:
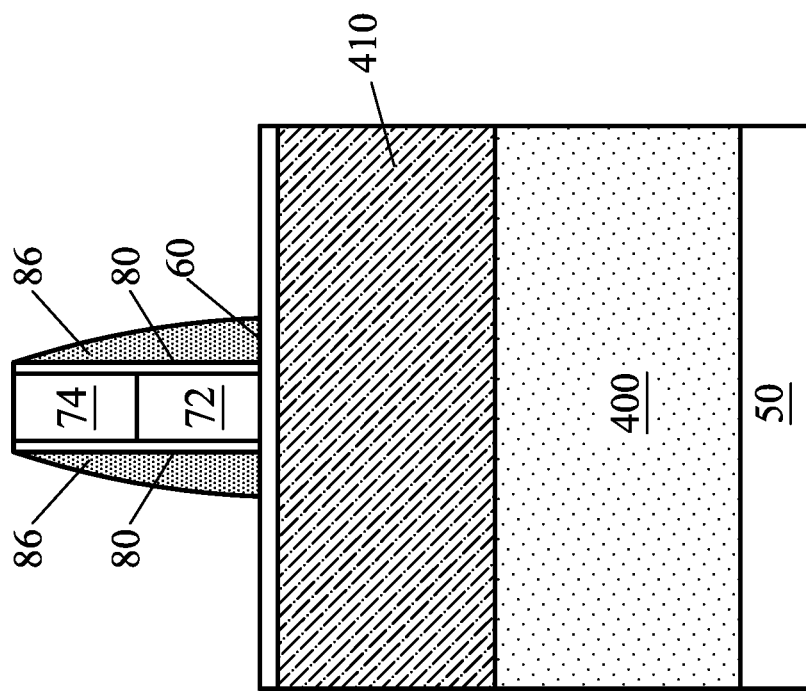
Figure 23A:
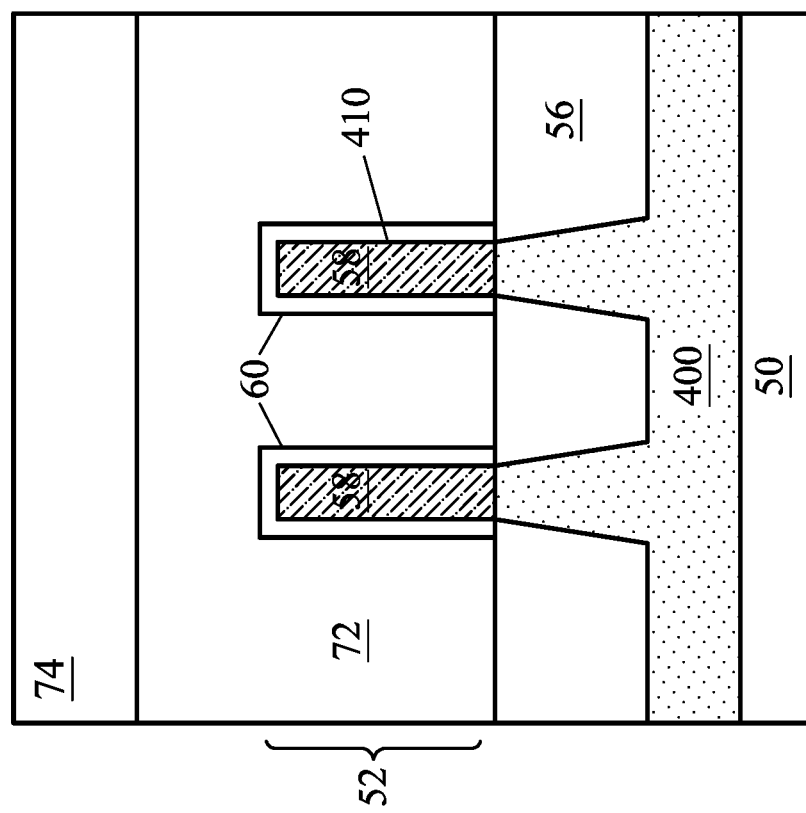

FIGS. 22A and 22B illustrate features in region 50P, and FIGS. 23A and 23B illustrate features in region 50N. In FIGS. 22A through 23B, gate spacers 86 are formed on the gate seal spacers 80 along sidewalls of the dummy gates 72 and the masks 74. The gate spacers 86 may be formed by conformally depositing an insulating material and subsequently anisotropically etching the insulating material. The insulating material of the gate spacers 86 may be silicon nitride, SiCN, a combination thereof, or the like.

Figure 25B:
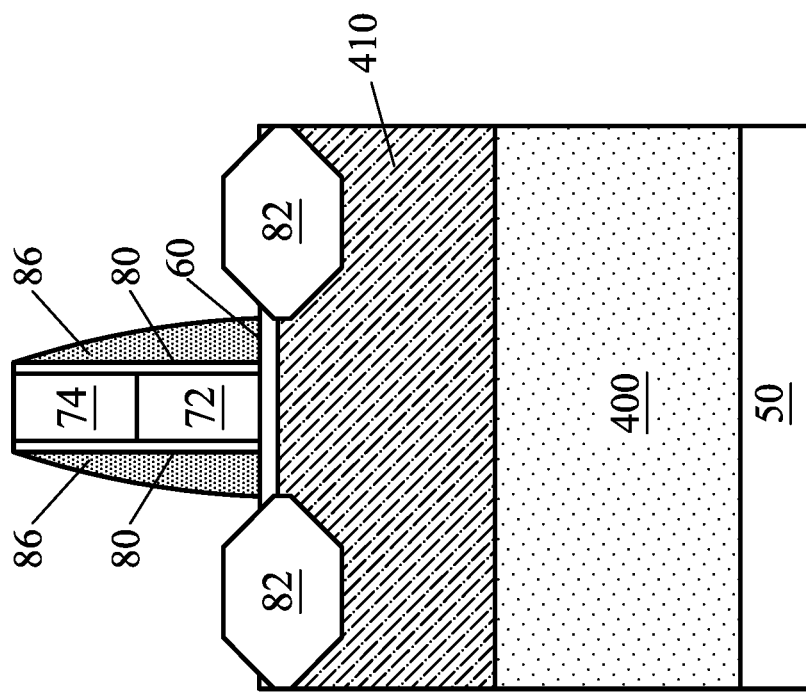
Figure 25A:
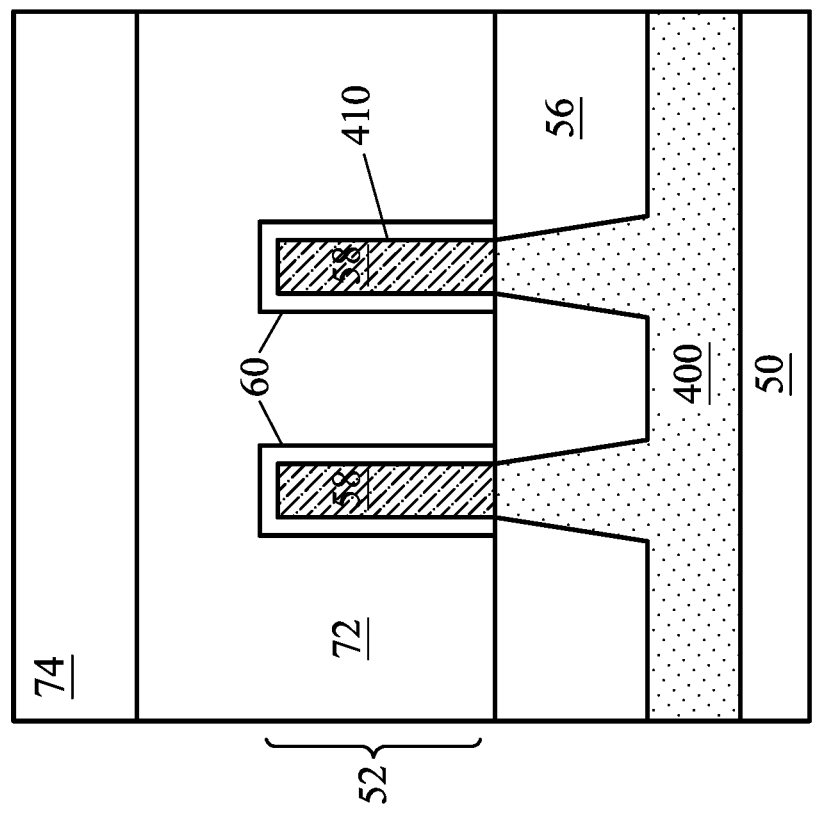

FIGS. 24A and 24B illustrate features in region 50P, and FIGS. 25A and 25B illustrate features in region 50N. In FIGS. 24A through 25B epitaxial source/drain regions 82 are formed in the fins 52 to exert stress in the respective channel regions 58, thereby improving performance. The epitaxial source/drain regions 82 are formed in the fins 52 such that each dummy gate 72 is disposed between respective neighboring pairs of the epitaxial source/drain regions 82. In some embodiments the epitaxial source/drain regions 82 may extend into the fins 52. In some embodiments, the gate spacers 86 are used to separate the epitaxial source/drain regions 82 from the dummy gates 72 by an appropriate lateral distance so that the epitaxial source/drain regions 82 do not short out subsequently formed gates of the resulting FinFETs.

The epitaxial source/drain regions 82 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 82 in the region 50N are epitaxially grown in the recesses. The epitaxial source/drain regions 82 may include any acceptable material, such as appropriate for n-type FinFETs. For example, if the fin 52 is silicon, the epitaxial source/drain regions 82 in the region 50N may include materials exerting a tensile strain in the channel region 58, such as silicon, SiC, SiCP, SiP, or the like. The epitaxial source/drain regions 82 in the region 50N may have surfaces raised from respective surfaces of the fins 52 and may have facets.

The epitaxial source/drain regions 82 in the region 50P, e.g., the PMOS region, may be formed by masking the region 50N, e.g., the NMOS region, and etching source/drain regions of the fins 52 in the region 50P are etched to form recesses in the fins 52. Then, the epitaxial source/drain regions 82 in the region 50P are epitaxially grown in the recesses. The epitaxial source/drain regions 82 may include any acceptable material, such as appropriate for p-type FinFETs. For example, the epitaxial source/drain regions 82 in the region 50P may comprise materials such as SiGe, SiB, or the like. The epitaxial source/drain regions 82 in the region 50P may also have surfaces raised from respective surfaces of the fins 52 and may have facets.

The epitaxial source/drain regions 82 and/or the fins 52 may be implanted with dopants to form source/drain regions, similar to the process previously discussed for forming lightly-doped source/drain regions, followed by an anneal. The source/drain regions may have an impurity concentration of between about $10^{19}$ cm$^{-3}$ and about $10^{21}$ cm$^{-3}$. The n-type and/or p-type impurities for source/drain regions may be any of the impurities previously discussed. In some embodiments, the epitaxial source/drain regions 82 may be in situ doped during growth.

Figure 26B:
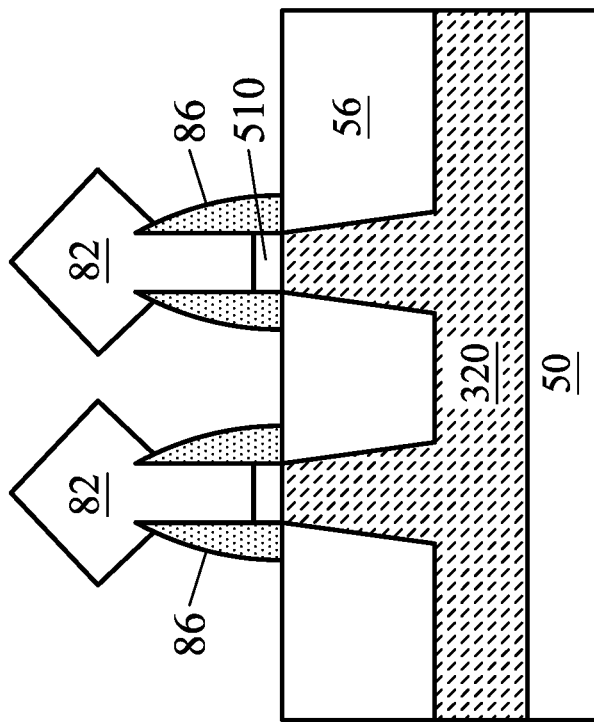
Figure 26A:
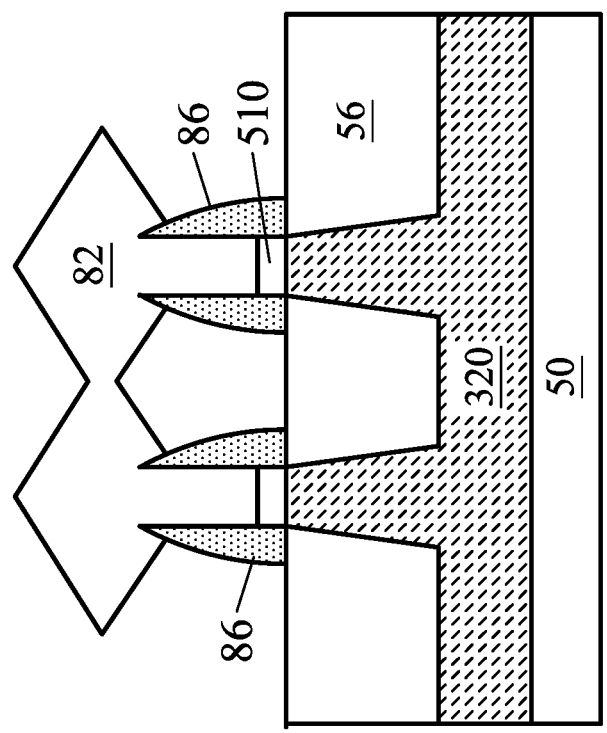
Figure 27B:
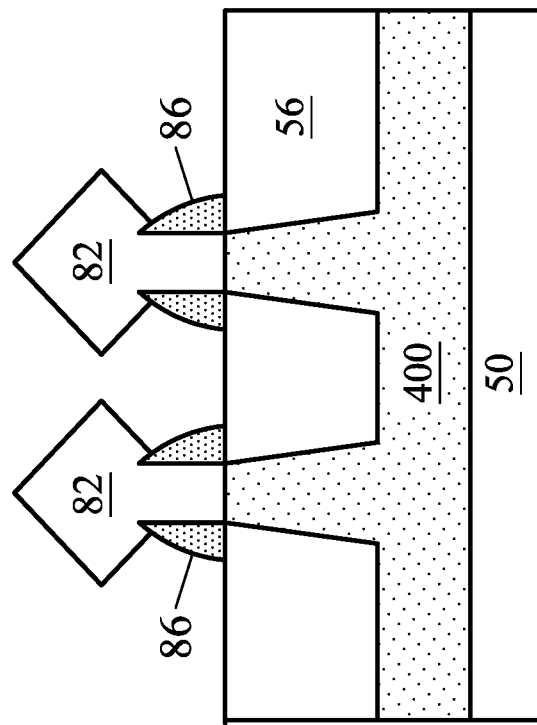
Figure 27A:
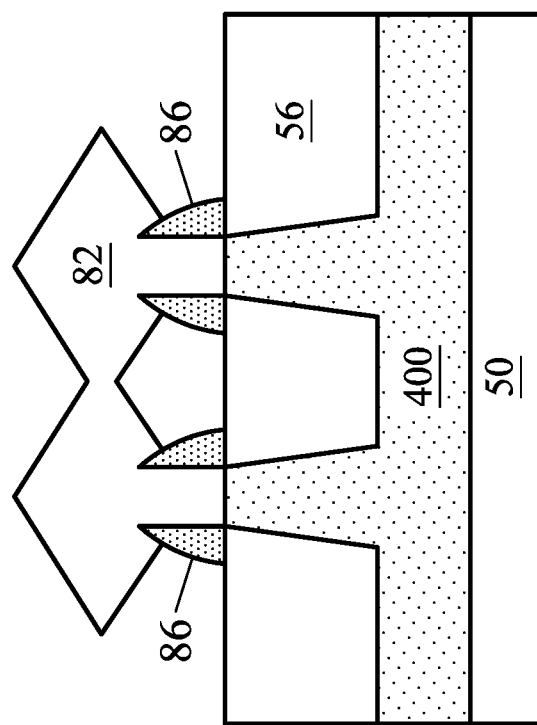

As a result of the epitaxy processes used to form the epitaxial source/drain regions 82 in the region 50P and the region 50N, upper surfaces of the epitaxial source/drain regions have facets which expand laterally outward beyond a sidewalls of the fins 52. In some embodiments, these facets cause adjacent source/drain regions 82 of a same finFET to merge as illustrated by FIGS. 26A and 27A. In other embodiments, adjacent source/drain regions 82 remain separated after the epitaxy process is completed as illustrated by FIGS. 26B and 27B.

Figure 28B:
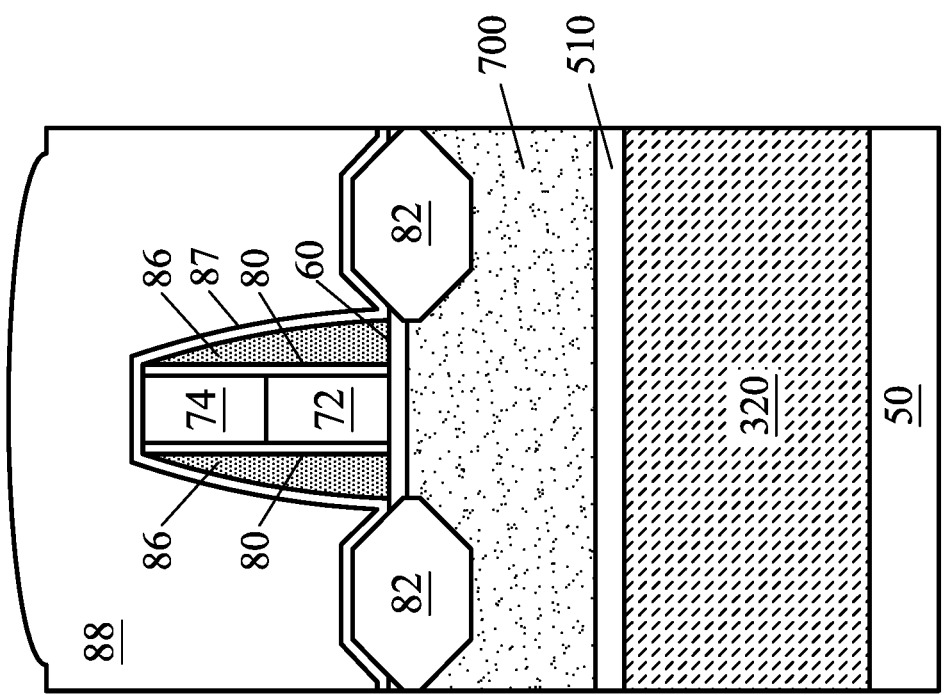
Figure 28A:
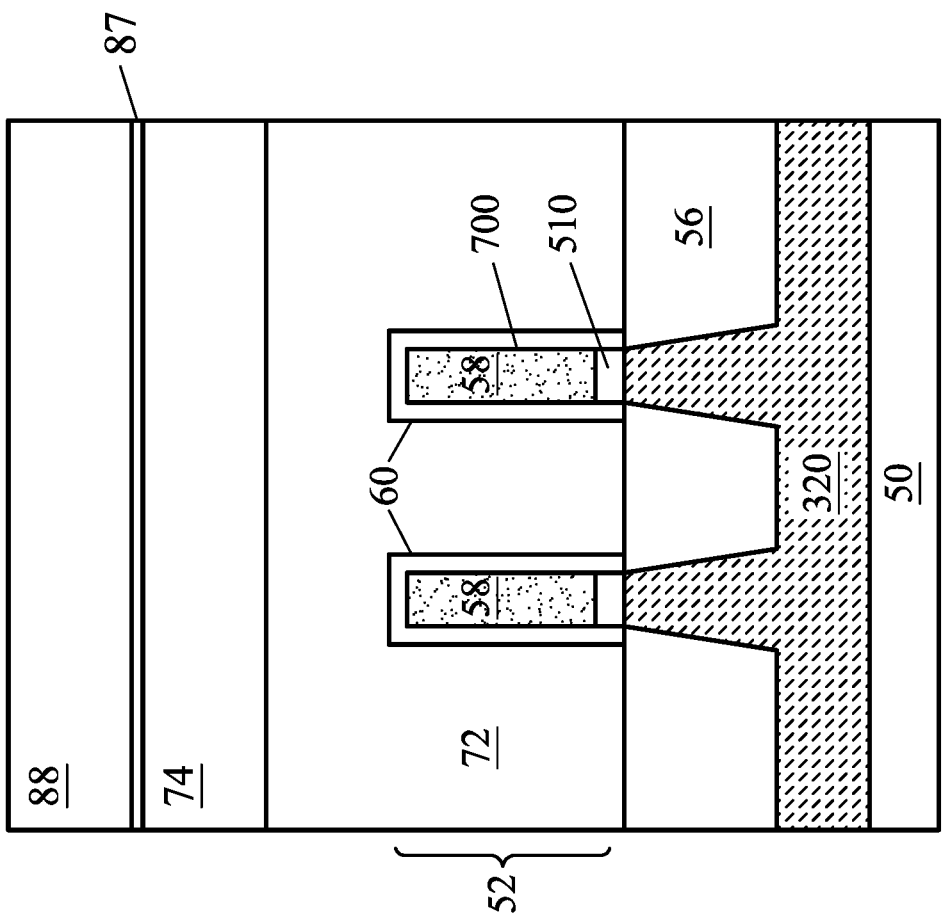
Figure 29B:
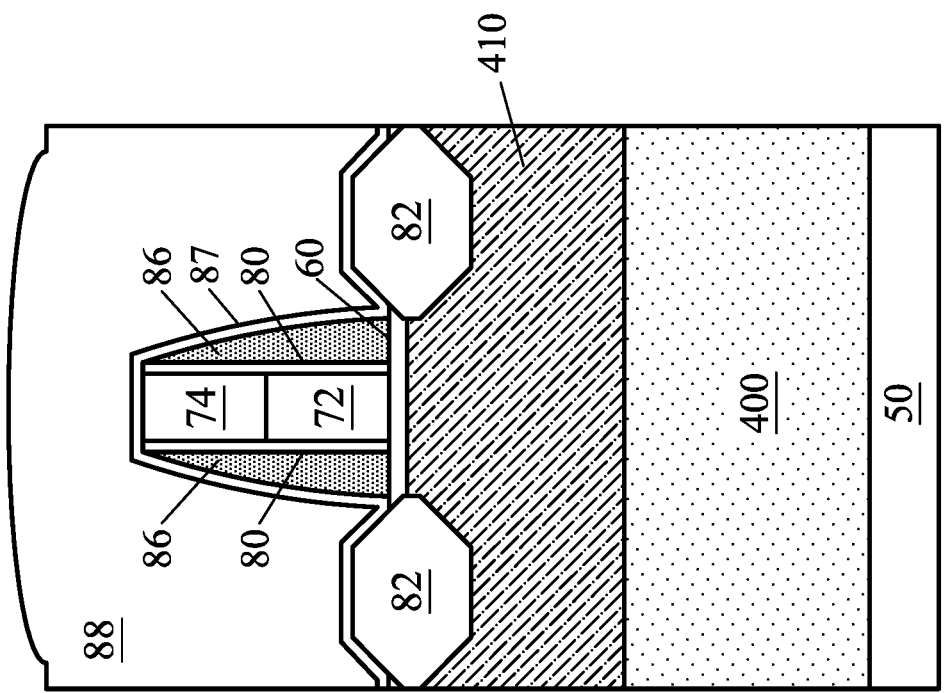
Figure 29A:
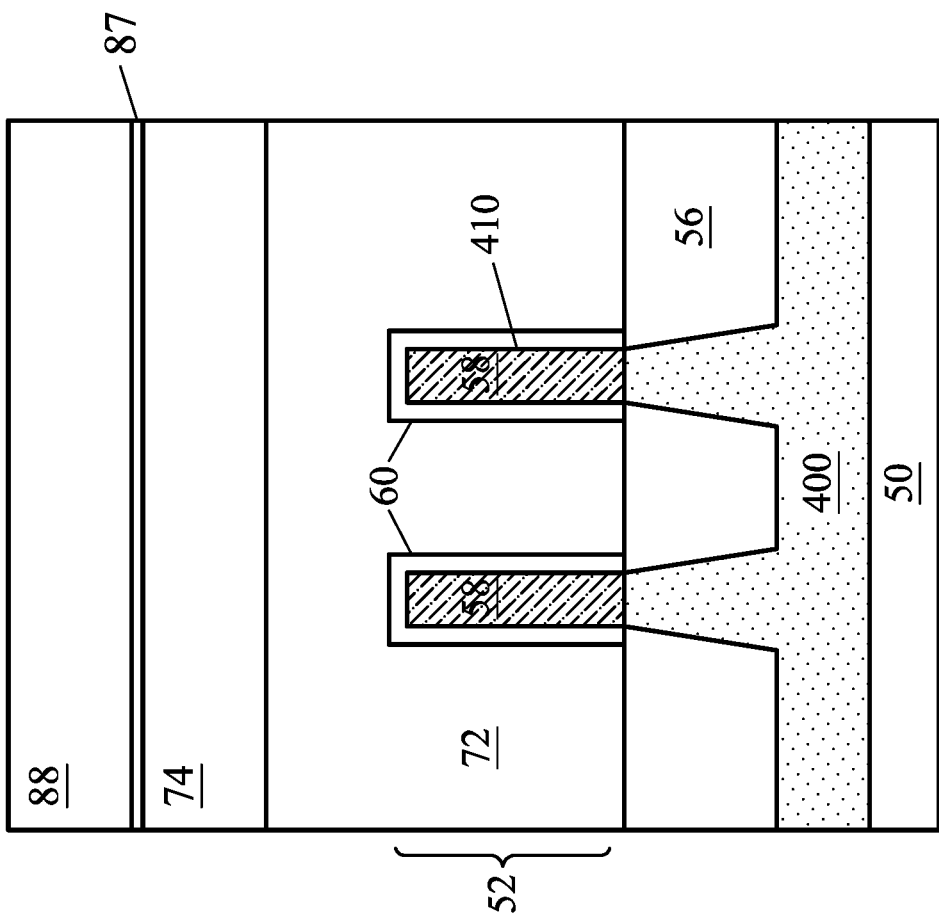

FIGS. 28A and 28B illustrate features in region 50P, and FIGS. 29A and 29B illustrate features in region 50N. In FIGS. 28A through 29B, a first ILD 88 is deposited over the structures illustrated in FIGS. 26A through 27B. The first ILD 88 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 87 is disposed between the first ILD 88 and the epitaxial source/drain regions 82, the hard mask 74, and the gate spacers 86. The CESL 87 may comprise a dielectric material, such as, silicon nitride, silicon oxide, silicon ox nitride, or the like, having a different etch rate than the material of the overlying first ILD 88.

Figure 30B:
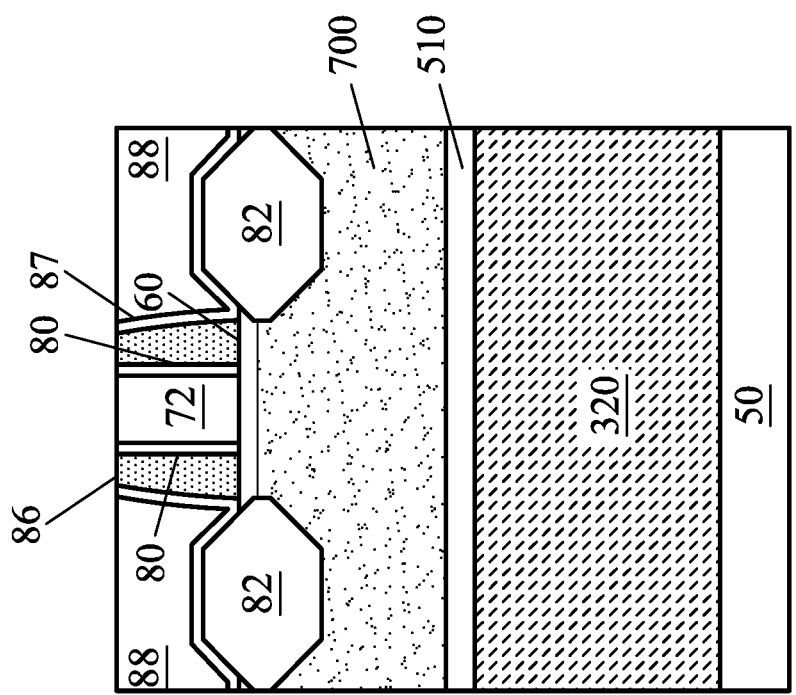
Figure 30A:
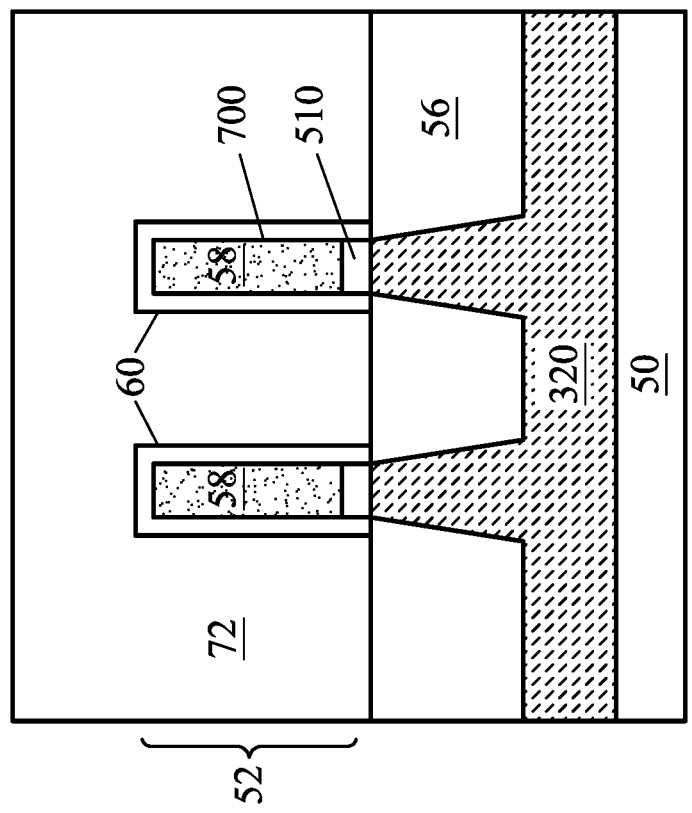
Figure 31B:
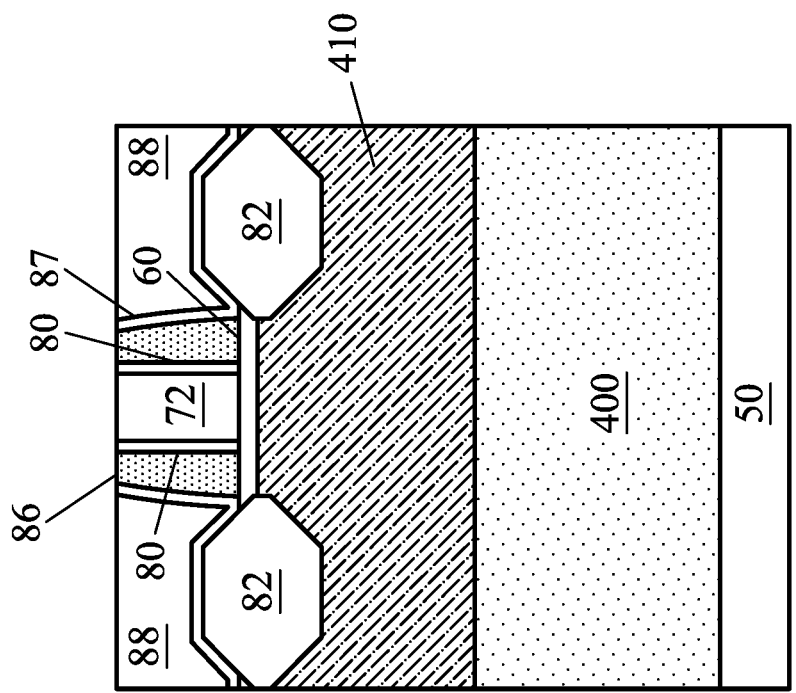
Figure 31A:
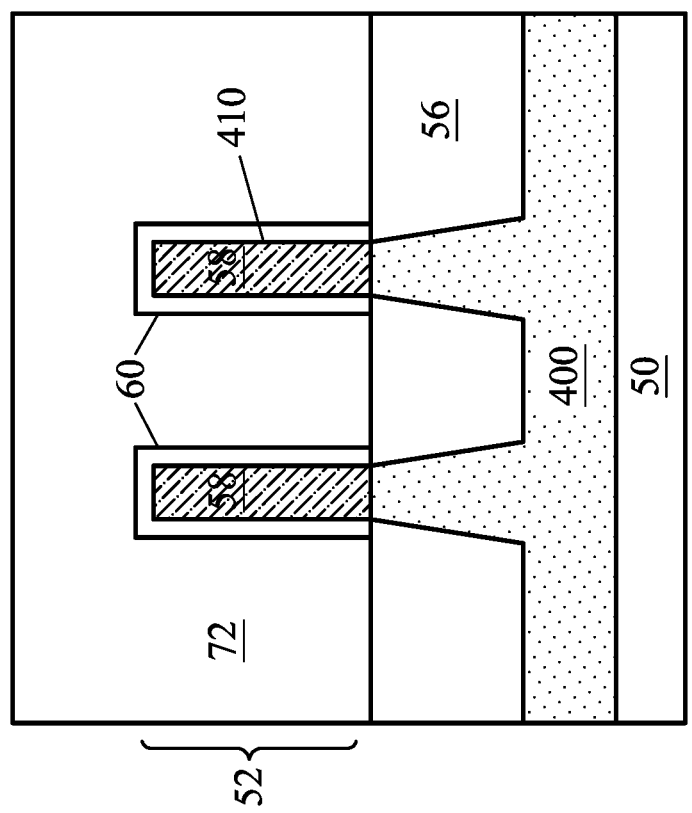

FIGS. 30A and 30B illustrate features in region 50P, and FIGS. 31A and 31B illustrate features in region 50N. In FIGS. 30A through 31B, a planarization process, such as a CMP, may be performed to level the top surface of the first ILD 88 with the top surfaces of the dummy gates 72. The planarization process may also remove the masks 74 on the dummy gates 72, and portions of the gate seal spacers 80 and the gate spacers 86 along sidewalls of the masks 74. After the planarization process, top surfaces of the dummy gates 72, the gate seal spacers 80, the gate spacers 86, and the first ILD 88 are level. Accordingly, the top surfaces of the dummy gates 72 are exposed through the first ILD 88.

Figure 32B:
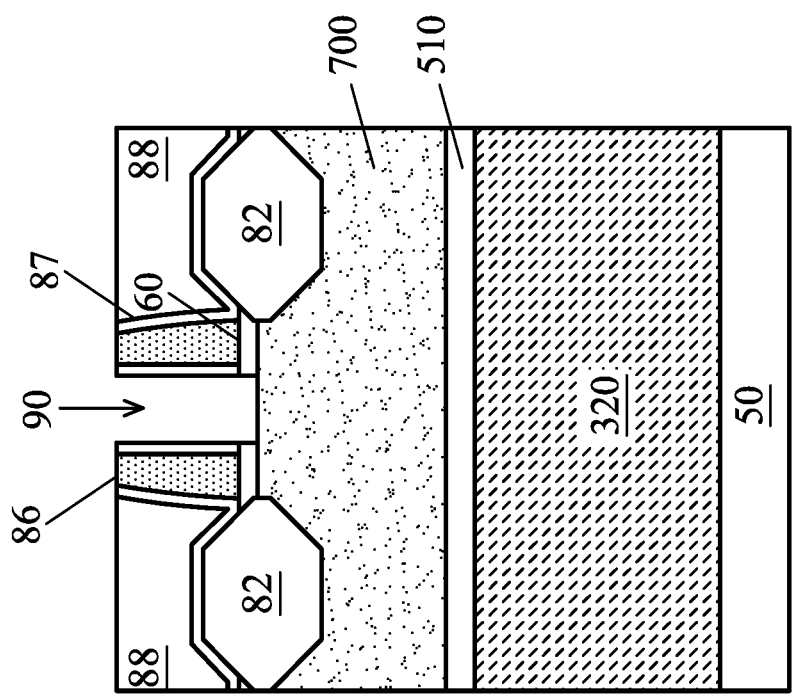
Figure 32A:
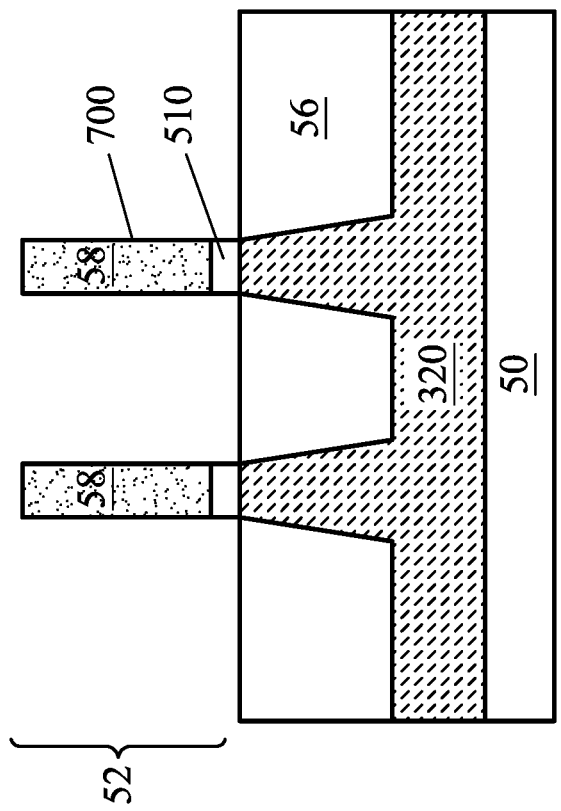
Figure 33B:
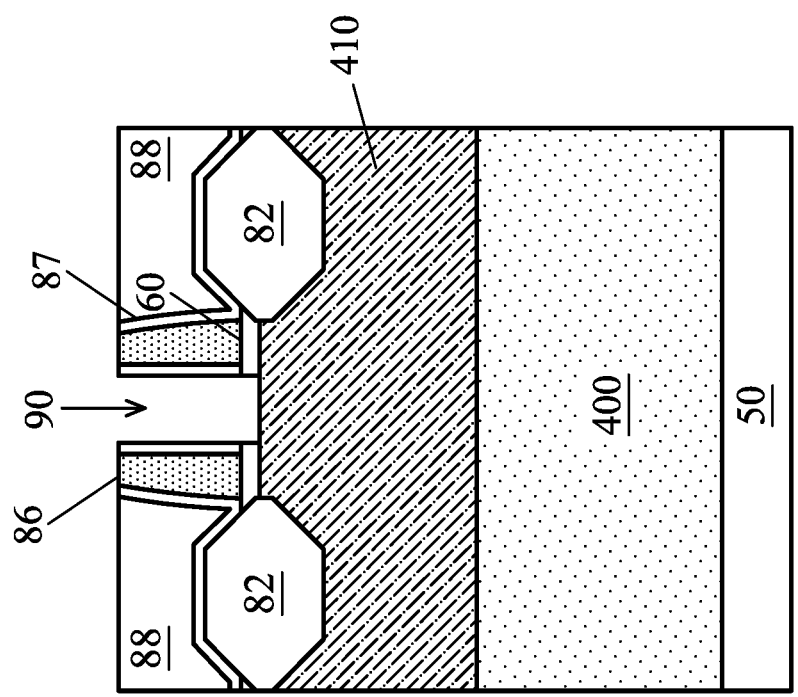
Figure 33A:
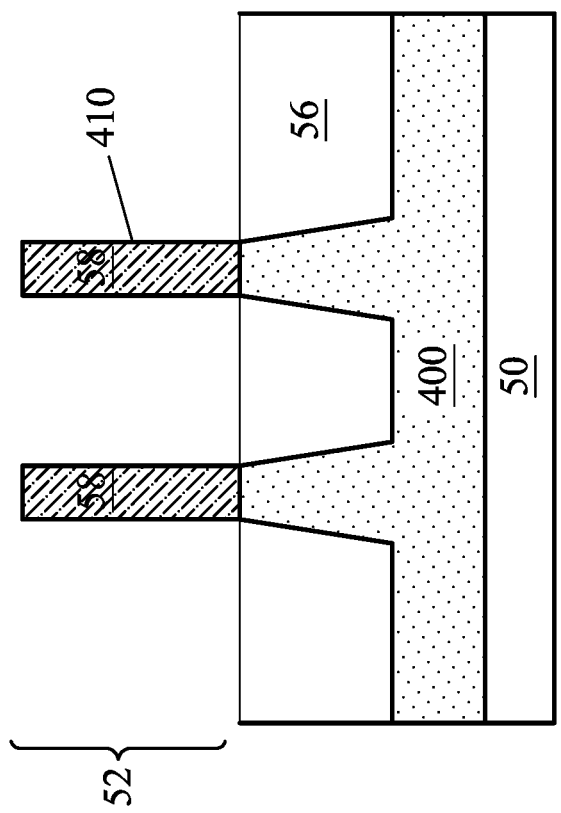

FIGS. 32A and 32B illustrate features in region 50P, and FIGS. 33A and 33B illustrate features in region 50N. In FIGS. 32A through 33B, the dummy gates 72 are removed in an etching step(s), so that recesses 90 are formed. Portions of the dummy dielectric layer 60 in the recesses 90 may also be removed. In some embodiments, only the dummy gates 72 are removed and the dummy dielectric layer 60 remains and is exposed by the recesses 90. In some embodiments, the dummy dielectric layer 60 is removed from recesses 90 in a first region of a die (e.g., a core logic region) and remains in recesses 90 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 88 or the gate spacers 86. Each recess 90 exposes a channel region 58 of a respective fin 52. Each channel region 58 is disposed between neighboring pairs of the epitaxial source/drain regions 82. During the removal, the dummy dielectric layer 60 may be used as an etch stop layer when the dummy gates 72 are etched. The dummy dielectric layer 60 may then be optionally removed after the removal of the dummy gates 72.

Figure 34B:
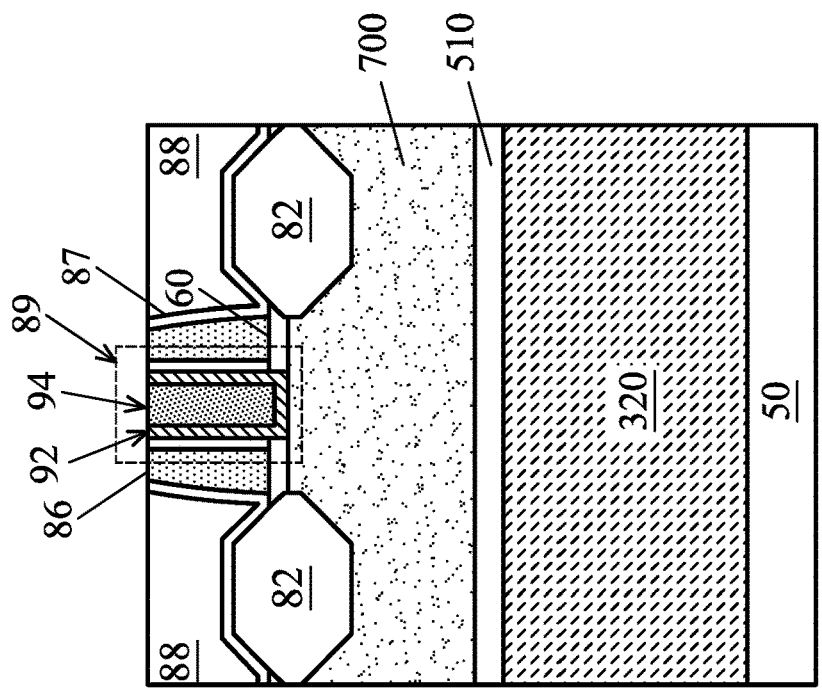
Figure 34A:
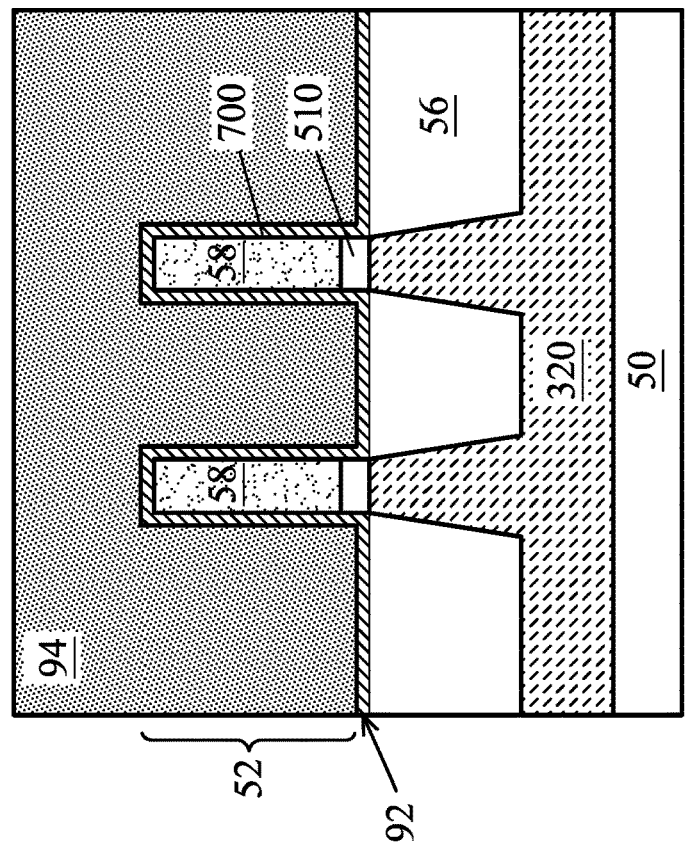
Figure 35B:
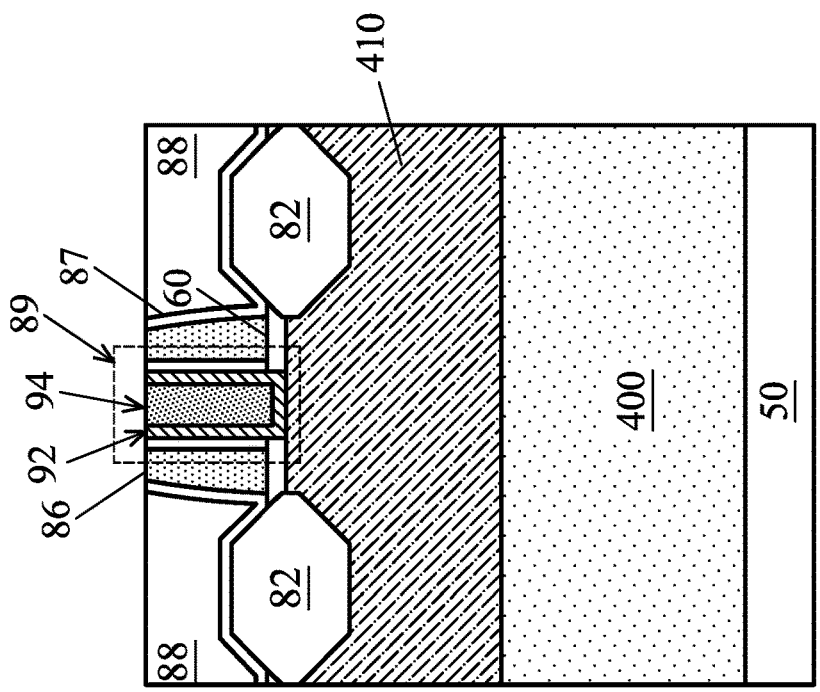
Figure 35A:
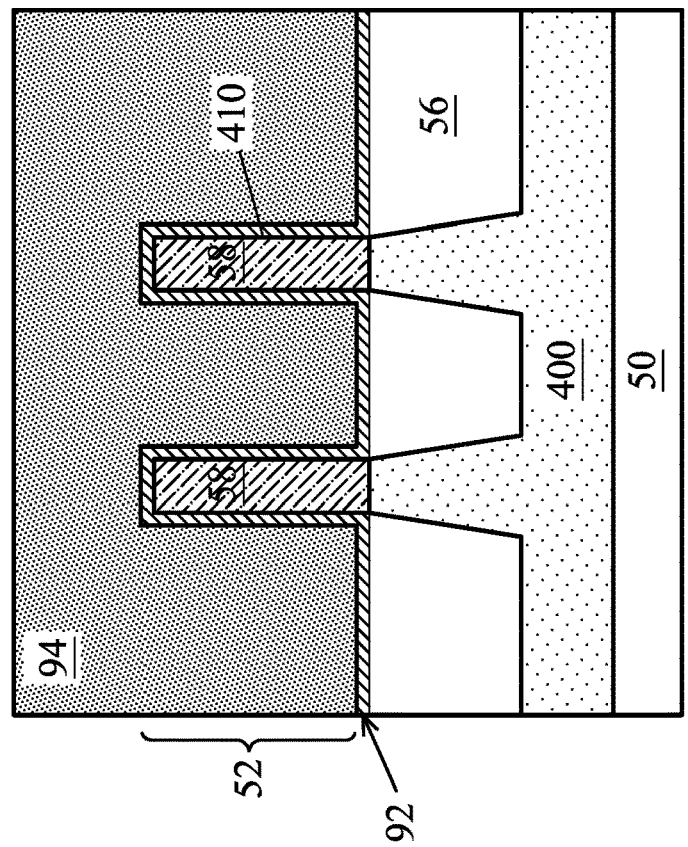
Figure 35C:
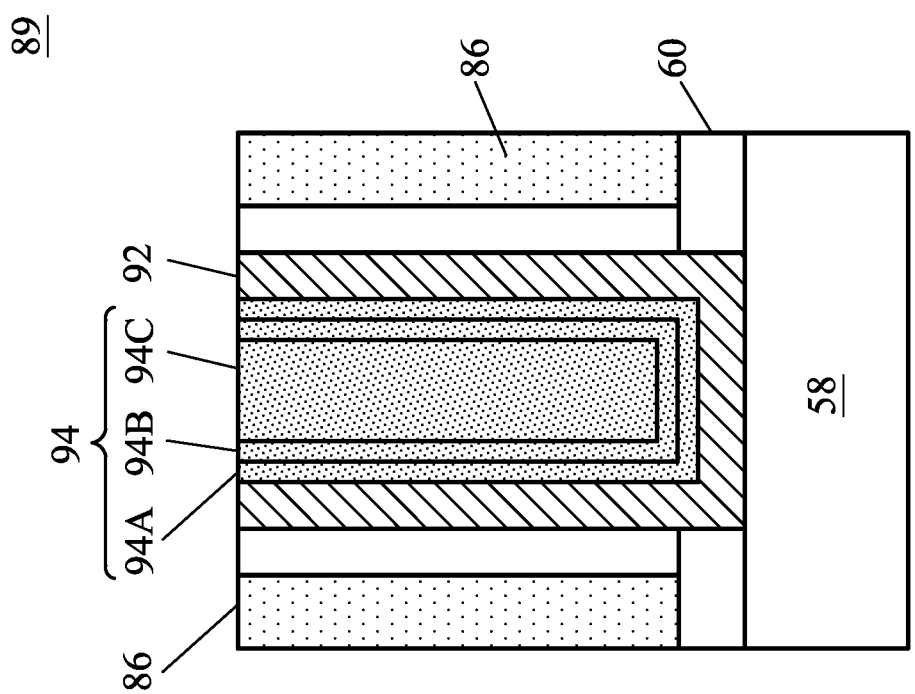

FIGS. 34A and 34B illustrate features in region 50P, and FIGS. 35A and 35B illustrate features in region 50N. In FIGS. 34A through 35B, gate dielectric layers 92 and gate electrodes 94 are formed for replacement gates. FIG. 35C illustrates a detailed view of region 89 of FIGS. 34B and 35B. Gate dielectric layers 92 are deposited conformally in the recesses 90, such as on the top surfaces and the sidewalls of the fins 52 and on sidewalls of the gate seal spacers 80/gate spacers 86. The gate dielectric layers 92 may also be formed on top surface of the first ILD 88. In accordance with some embodiments, the gate dielectric layers 92 comprise silicon oxide, silicon nitride, or multilayers thereof. In some embodiments, the gate dielectric layers 92 are a high-k dielectric material, and in these embodiments, the gate dielectric layers 92 may have a k value greater than about 7.0, and may include a metal oxide or a silicate of Hf, Al, Zr, La, Mg, Ba, Ti, Pb, and combinations thereof. The formation methods of the gate dielectric layers 92 may include Molecular-Beam Deposition (MBD), ALD, PECVD, and the like. In embodiments where portions of the dummy gate dielectric 60 remains in the recesses 90, the gate dielectric layers 92 include a material of the dummy gate dielectric 60 (e.g., SiO).

The gate electrodes 94 are deposited over the gate dielectric layers 92, respectively, and fill the remaining portions of the recesses 90. The gate electrodes 94 may be a metal-containing material such as TiN, TiO, TaN, TaC, Co, Ru, Al, W, combinations thereof, or multi-layers thereof. For example, although a single layer gate electrode 94 is illustrated in FIGS. 34B and 35B, the gate electrode 94 may comprise any number of liner layers 94A, any number of work function tuning layers 94B, and a fill material 94C as illustrated by FIG. 35C. After the filling of the gate electrodes 94, a planarization process, such as a CMP, may be performed to remove the excess portions of the gate dielectric layers 92 and the material of the gate electrodes 94, which excess portions are over the top surface of the ILD 88. The remaining portions of material of the gate electrodes 94 and the gate dielectric layers 92 thus form replacement gates of the resulting FinFETs. The gate electrodes 94 and the gate dielectric layers 92 may be collectively referred to as a "gate stack." The gate and the gate stacks may extend along sidewalls of a channel region 58 of the fins 52.

The formation of the gate dielectric layers 92 in the region 50N and the region 50P may occur simultaneously such that the gate dielectric layers 92 in each region are formed from the same materials, and the formation of the gate electrodes 94 may occur simultaneously such that the gate electrodes 94 in each region are formed from the same materials. In some embodiments, the gate dielectric layers 92 in each region may be formed by distinct processes, such that the gate dielectric layers 92 may be different materials, and/or the gate electrodes 94 in each region may be formed by distinct processes, such that the gate electrodes 94 may be different materials. Various masking steps may be used to mask and expose appropriate regions when using distinct processes.

Figure 36B:
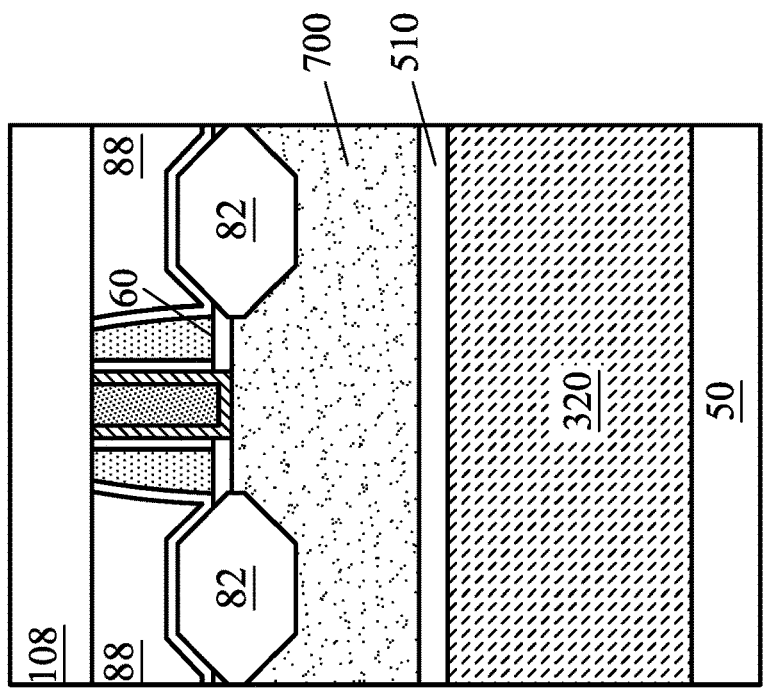
Figure 36A:
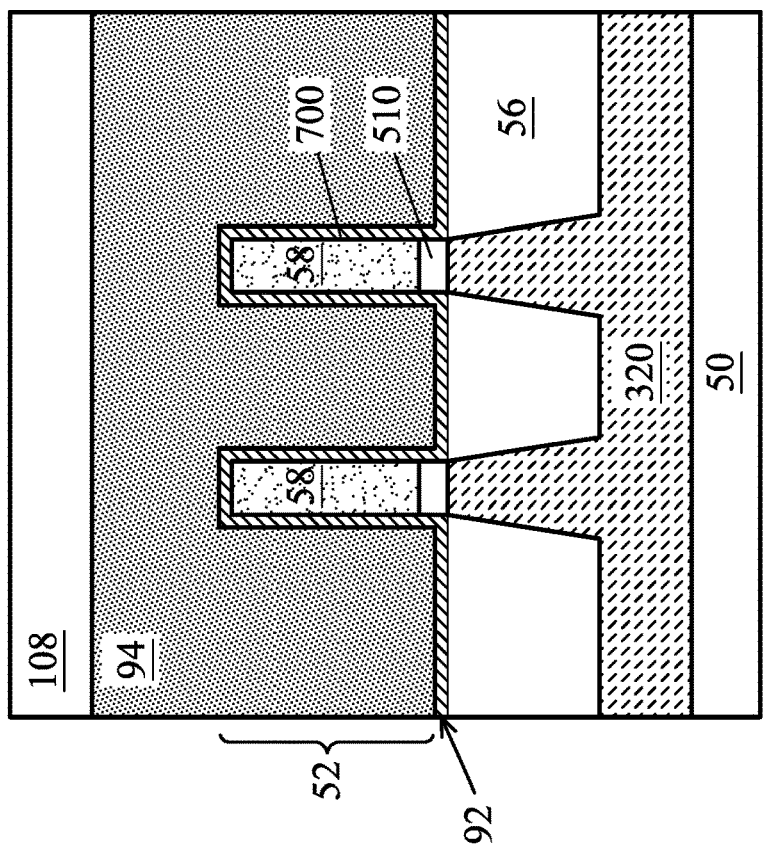
Figure 37B:
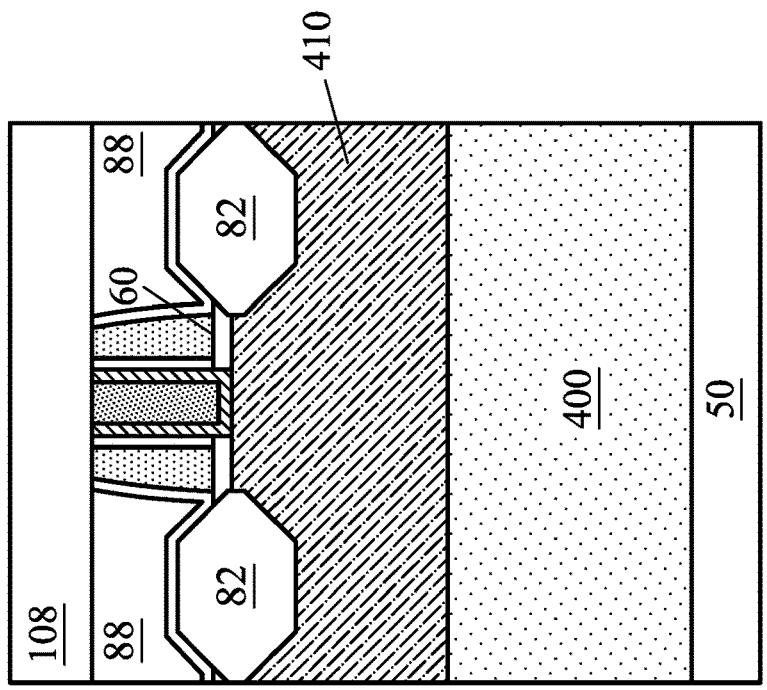
Figure 37A:
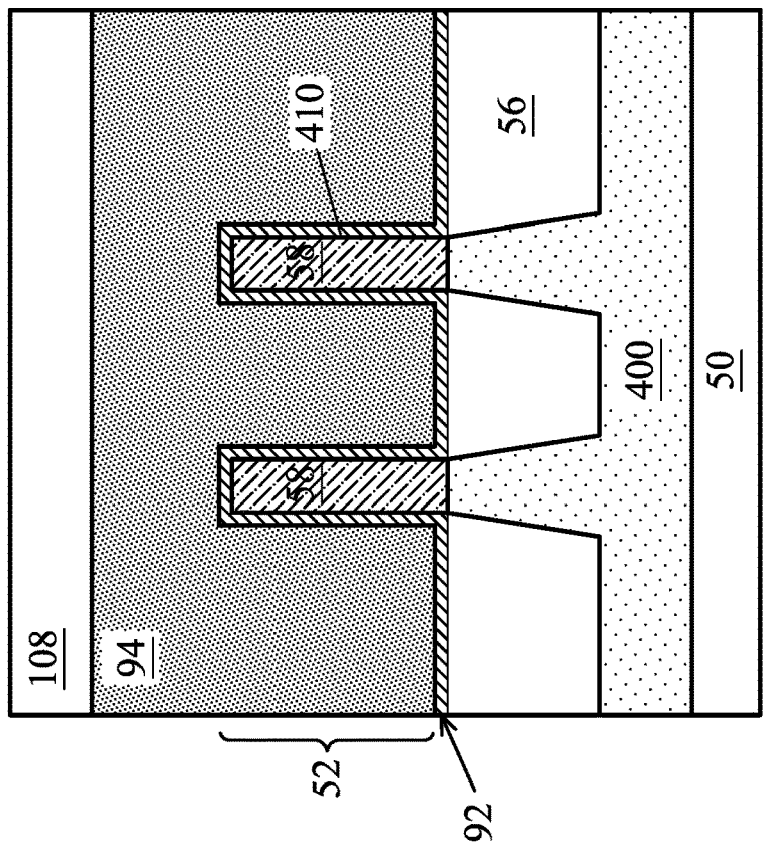

FIGS. 36A and 36B illustrate features in region 50P, and FIGS. 37A and 37B illustrate features in region 50N. In FIGS. 36A through 37B, a second ILD 108 is deposited over the first ILD 88. In an embodiment, the second ILD 108 is a flowable film formed by a flowable CVD method. In some embodiments, the second ILD 108 is formed of a dielectric material such as PSG, BSG, BPSG, USG, or the like, and may be deposited by any suitable method, such as CVD and PECVD.

Figure 38B:
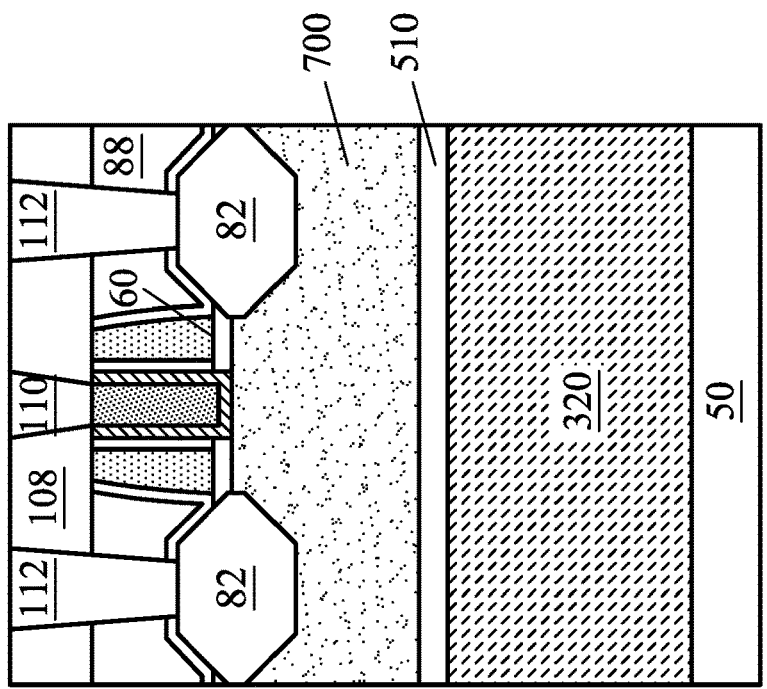
Figure 38A:
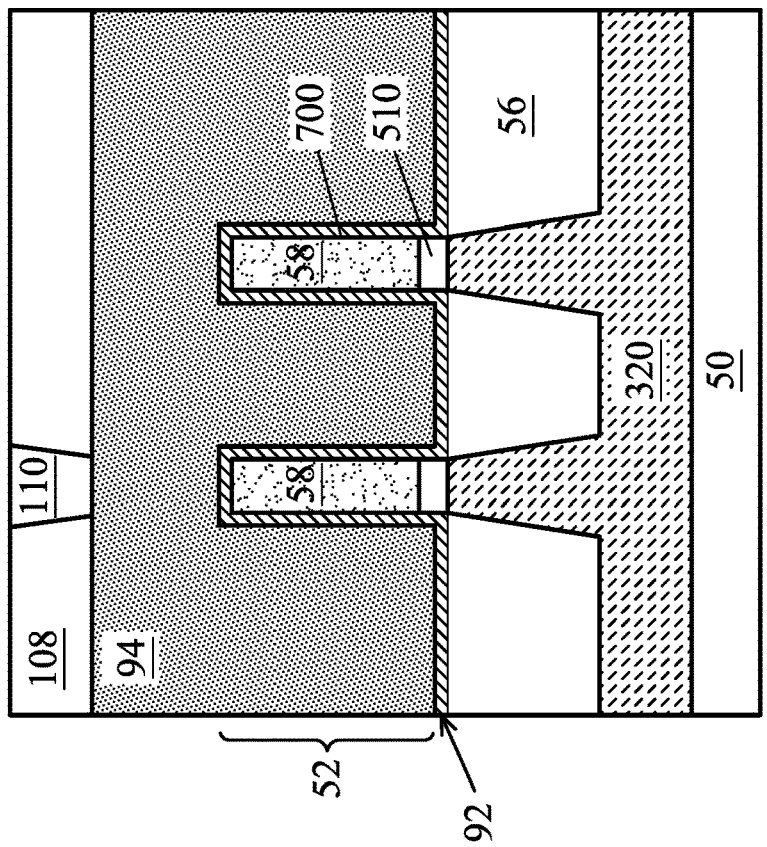
Figure 39B:
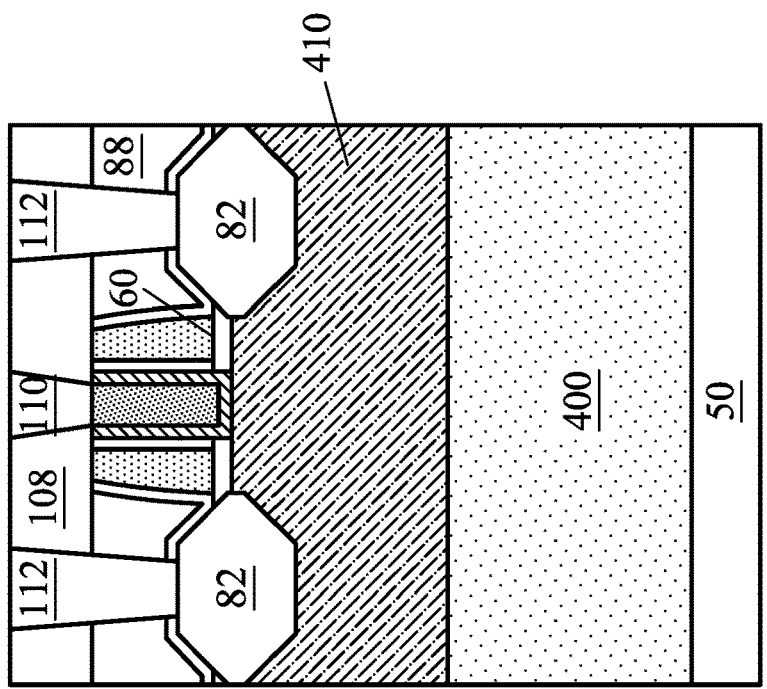
Figure 39A:
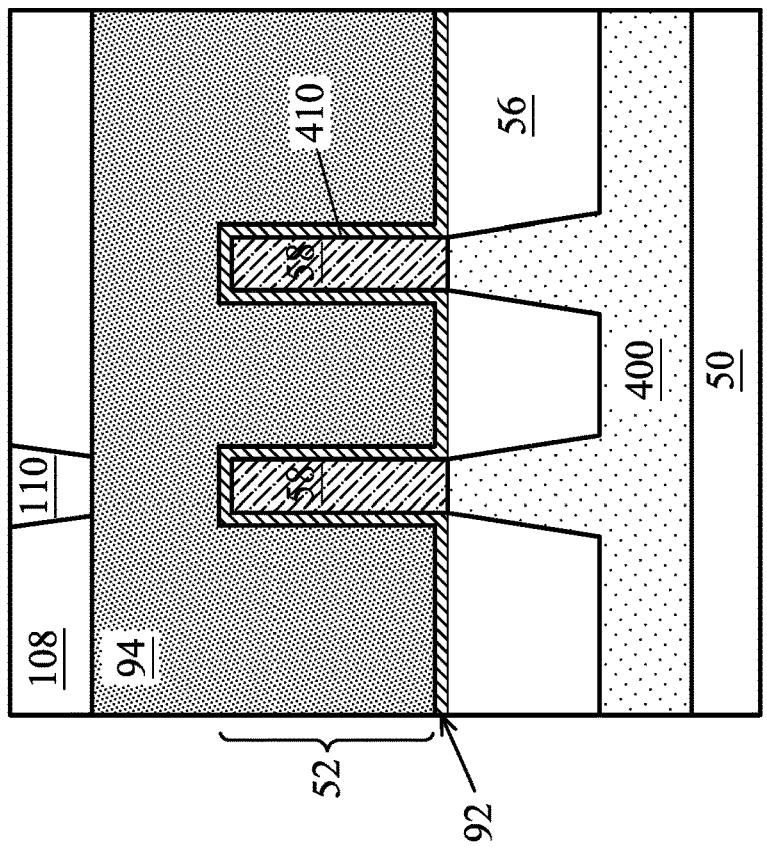

FIGS. 38A and 38B illustrate features in region 50P, and FIGS. 39A and 39B illustrate features in region 50N. In FIGS. 38A through 39B, gate contacts 110 and source/drain contacts 112 are formed through the second ILD 108 and the first ILD 88 in accordance with some embodiments. Openings for the source/drain contacts 112 are formed through the first and second ILDs 88 and 108, and openings for the gate contact 110 are formed through the second ILD 108. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the ILD 108. The remaining liner and conductive material form the source/drain contacts 112 and gate contacts 110 in the openings. An anneal process may be performed to form a silicide at the interface between the epitaxial source/drain regions 82 and the source/drain contacts 112. The source/drain contacts 112 are physically and electrically coupled to the epitaxial source/drain regions 82, and the gate contacts 110 are physically and electrically coupled to the gate electrodes 94. The source/drain contacts 112 and gate contacts 110 may be formed in different processes, or may be formed in the same process. Although shown as being formed in the same cross-sections, it should be appreciated that each of the source/drain contacts 112 and gate contacts 110 may be formed in different cross-sections, which may avoid shorting of the contacts.

The embodiments of the present disclosure have some advantageous features. The removal of a hard mask layer prior to performing a CMP process on a first epitaxial layer and a second epitaxial layer of a wafer allows for a more balanced and uniform loading effect on top surfaces of the first epitaxial layer and the second epitaxial layer during the CMP process, and allows a polish rate of the first epitaxial layer to be closer to a polish rate of the second epitaxial layer during the CMP process. The hard mask layer is a potential scratch source during the CMP process and hence its removal prior to the CMP process leads to a reduction in a number of surface scratches on the top surfaces of the first epitaxial layer and the second epitaxial layer after the CMP process. In addition, embodiments disclosed herein allow for the easier removal of CMP slurry that is used during the CMP process from the bottom of alignment mark trenches and from surfaces of the wafer. This would allow for a reduction in peeling of a subsequently deposited film on the outer perimeter of the wafer during a subsequent patterning process. Embodiments disclosed herein also allow a top surface of the wafer to have a more uniform topography after the CMP process as well as allowing the outer perimeter of the wafer to have a reduced variation of the dimensions of the smallest geometrical features (critical dimension CD) upon further processing. After the CMP process, a polished top surface at the outer perimeter of the wafer has a level substantially close to a level of a polished top surface at the center of the wafer. Further, by combining the removal of the hard mask layer prior to the CMP process and the use of the CMP slurry during the CMP process, a sensitivity of the CMP process to polishing time may be reduced.

In accordance with an embodiment, a method includes forming a first epitaxial layer over a substrate to form a wafer; depositing a dielectric layer over the first epitaxial layer; patterning the dielectric layer to form an opening; etching the first epitaxial layer through the opening to form a recess; forming a second epitaxial layer in the recess; etching the dielectric layer to expose a top surface of the first epitaxial layer; and planarizing the exposed top surface of the first epitaxial layer and a top surface of the second epitaxial layer. In an embodiment, the dielectric layer includes an oxide or a nitride. In an embodiment, after etching the dielectric layer the top surface of the second epitaxial layer is higher than the exposed top surface of the first epitaxial layer. In an embodiment, etching the dielectric layer includes a wet etching process using dilute hydrofluoric acid (dHF). In an embodiment, the first epitaxial layer includes a first material and the second epitaxial layer includes a second material, where the first material has a different lattice constant than the second material. In an embodiment, planarizing the exposed top surface of the first epitaxial layer and the top surface of the second epitaxial layer includes performing a chemical mechanical planarization (CMP) process on a top surface of the wafer. In an embodiment, after planarizing the exposed top surface of the first epitaxial layer and the top surface of the second epitaxial layer a total number of surface scratches on the top surface of the wafer is $4\times10^1$ or lower. In an embodiment, the method further includes a wet clean process after planarizing the exposed top surface of the first epitaxial layer and the top surface of the second epitaxial layer, where the wafer includes trenches that form an alignment mark, and where after the wet clean process a bottom of the trenches of the alignment mark has $8\times10^2$ or fewer unremoved slurry particles.

In accordance with yet another embodiment, a method includes forming a first doped region and a second doped region in a top portion of a substrate; growing a first epitaxial layer over the substrate, where the first epitaxial layer directly contacts the first doped region and the second doped region; depositing a hard mask layer over the first epitaxial layer; etching an opening in a first portion of the hard mask layer to expose a first top surface of the first epitaxial layer; etching the first epitaxial layer through the opening to form a recess, where the recess is directly over the first doped region; growing a second epitaxial layer in the recess; removing remaining portions of the hard mask layer to expose a second top surface of the first epitaxial layer, where a top surface of the second epitaxial layer is higher than the exposed second top surface of the first epitaxial layer; and planarizing the top surface of the second epitaxial layer and the exposed second top surface of the first epitaxial layer. In an embodiment, after removing remaining portions of the hard mask layer a portion of the second epitaxial layer directly contacts a topmost surface of the first epitaxial layer. In an embodiment, after the planarizing a top surface of the second epitaxial layer is above a top surface of the first doped region by a first height in a range of about 30 nm to about 80 nm, and a top surface of the first epitaxial layer is above a top surface of the second doped region by a second height in a range of about 30 nm to about 80 nm. In an embodiment, the first height and the second height are the same. In an embodiment, the first epitaxial layer includes silicon and the second epitaxial layer includes silicon germanium. In an embodiment, etching the opening in the first portion of the hard mask layer includes a plasma etching process.

In accordance with yet another embodiment, a method includes forming a first epitaxial layer over a substrate; forming a recess in the first epitaxial layer; forming a second epitaxial layer in the recess; and planarizing a top surface of the first epitaxial layer and a top surface of the second epitaxial layer, where planarizing the top surface of the first epitaxial layer and the top surface of the second epitaxial layer includes using a chemical mechanical polish (CMP) slurry, the CMP slurry including a polymer that selectively reduces a removal rate of the first epitaxial layer, where the slurry includes an abrasive that has a concentration in a range from about 0.5 to about 1.5 percent by weight. In an embodiment, the slurry includes an acid that increases a rate of material removal. In an embodiment, the acid includes lactic acid, acetic acid, formic acid, citric acid, or oxalic acid. In an embodiment, a concentration of the acid is in a range from about 5 percent to about 35 percent. In an embodiment, the abrasive may have a mean size that is in a range from about 25 nm to about 45 nm. In an embodiment, the polymer includes polyethylene glycol.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    forming a first epitaxial layer over a substrate to form a wafer;
    depositing a dielectric layer over the first epitaxial layer;
    patterning the dielectric layer to form an opening;
    etching the first epitaxial layer through the opening to form a recess;
    forming a second epitaxial layer in the recess;
    removing the dielectric layer using a wet etching process to expose a top surface of the first epitaxial layer; and
    after removing the dielectric layer, planarizing the exposed top surface of the first epitaxial layer and a top surface of the second epitaxial layer.

2. The method of claim 1, wherein the dielectric layer comprises an oxide or a nitride.

3. The method of claim 1, wherein after removing the dielectric layer the top surface of the second epitaxial layer is higher than the exposed top surface of the first epitaxial layer.

4. The method of claim 1, wherein removing the dielectric layer comprises the wet etching process using an etchant that includes hydrofluoric acid.

5. The method of claim 1, wherein the first epitaxial layer comprises a first material and the second epitaxial layer comprises a second material, wherein the first material has a different lattice constant than the second material.

6. The method of claim 1, wherein planarizing the exposed top surface of the first epitaxial layer and the top surface of the second epitaxial layer comprises performing a chemical mechanical planarization (CMP) process on a top surface of the wafer.

7. The method of claim 1, further comprising a wet clean process after planarizing the exposed top surface of the first epitaxial layer and the top surface of the second epitaxial layer, the wet clean process comprising polishing the wafer using an abrasive material in a slurry.

8. The method of claim 1 further comprising:
    forming a seed layer on a bottom surface and sidewalls of the recess, wherein a material of the seed layer and a material of the second epitaxial layer are different.

9. A method of forming a semiconductor device, the method comprising:
    forming a first doped region and a second doped region in a top portion of a substrate;
    growing a first epitaxial layer over the substrate, wherein the first epitaxial layer directly contacts the first doped region and the second doped region;
    depositing a hard mask layer over the first epitaxial layer;
    etching an opening in a first portion of the hard mask layer to expose a first top surface of the first epitaxial layer;
    etching the first epitaxial layer through the opening to form a recess, wherein the recess is directly over the first doped region;
    growing a second epitaxial layer in the recess;
    removing remaining portions of the hard mask layer to expose a second top surface of the first epitaxial layer, wherein a top surface of the second epitaxial layer is higher than the exposed second top surface of the first epitaxial layer; and planarizing the top surface of the second epitaxial layer and the exposed second top surface of the first epitaxial layer.

10. The method of claim 9, wherein after removing remaining portions of the hard mask layer a portion of the second epitaxial layer directly contacts a topmost surface of the first epitaxial layer.

11. The method of claim 9, wherein after the planarizing a top surface of the second epitaxial layer is above a top surface of the first doped region by a first height in a range of about 30 nm to about 80 nm, and a top surface of the first epitaxial layer is above a top surface of the second doped region by a second height in a range of about 30 nm to about 80 nm.

12. The method of claim 11, wherein the first height and the second height are the same.

13. The method of claim 9, wherein the first epitaxial layer comprises silicon and the second epitaxial layer comprises silicon germanium.

14. The method of claim 9, wherein etching the opening in the first portion of the hard mask layer comprises a plasma etching process.

15. A method of forming a semiconductor device, the method comprising:

forming a first epitaxial layer over a substrate;

forming a recess in the first epitaxial layer;

forming a second epitaxial layer in the recess; and planarizing a top surface of the first epitaxial layer and a top surface of the second epitaxial layer, wherein planarizing the top surface of the first epitaxial layer and the top surface of the second epitaxial layer comprises using a chemical mechanical polish (CMP) slurry, the CMP slurry comprising a polymer that selectively reduces a removal rate of the first epitaxial layer, wherein the slurry comprises an abrasive that has a concentration in a range from about 0.5 to about 1.5 percent by weight.

16. The method of claim 15, wherein the slurry comprises an acid that increases a rate of material removal.

17. The method of claim 16, wherein the acid comprises lactic acid, acetic acid, formic acid, citric acid, or oxalic acid.

18. The method of claim 15, wherein the abrasive has a mean size that is in a range from about 25 nm to about 45 nm.

19. The method of claim 15, wherein the polymer comprises polyethylene glycol.

20. The method of claim 15, wherein a material of the first epitaxial layer and a material of the second epitaxial layer have different lattice constants.

* * * * *

UNITED STATES PATENT AND TRADEMARK OFFICE
CERTIFICATE OF CORRECTION

| | |
|---|---|
| PATENT NO. | : 11,387,109 B1 |
| APPLICATION NO. | : 17/193693 |
| DATED | : July 12, 2022 |
| INVENTOR(S) | : Chang et al. |

It is certified that error appears in the above-identified patent and that said Letters Patent is hereby corrected as shown below:

On the Title Page

Item (72), Inventors; delete "deseased" and insert --deceased--.

Signed and Sealed this
Eighteenth Day of April, 2023

*Katherine Kelly Vidal*

Katherine Kelly Vidal
*Director of the United States Patent and Trademark Office*